United States Patent
Yamakoshi et al.

(10) Patent No.: US 6,353,201 B1
(45) Date of Patent: Mar. 5, 2002

(54) DISCHARGE ELECTRODE, RF PLASMA GENERATION APPARATUS USING THE SAME, AND POWER SUPPLY METHOD

(75) Inventors: Hideo Yamakoshi; Kengou Yamaguchi, both of Yokohama; Masayoshi Murata, Nagasaki; Yoshiaki Takeuchi, Nagasaki; Yoshikazu Nawata, Nagasaki; Koji Satake, Yokohama; Satoshi Kokaji, Tokyo; Shoji Morita; Masatoshi Hisatome, both of Yokohama; Tatsuji Horioka, Tokyo; Hiroshi Mashima, Nagasaki, all of (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/614,134

(22) Filed: Jul. 11, 2000

(51) Int. Cl.$^7$ ................................................ B23K 10/00
(52) U.S. Cl. ............................ 219/121.52; 219/121.43; 118/723 I; 315/111.41
(58) Field of Search ............................ 219/121.52, 119, 219/121.36, 121.57, 121.43; 315/111.31, 111.41, 111.51; 156/345; 118/723 I

(56) References Cited

U.S. PATENT DOCUMENTS

| | | | | |
|---|---|---|---|---|
| 4,277,304 A | * | 7/1981 | Horiike et al. | 156/643 |
| 5,261,962 A | * | 11/1993 | Hamamoto et al. | 118/723 I |
| 5,619,103 A | * | 4/1997 | Tobin et al. | 315/111.21 |
| 5,981,899 A | * | 11/1999 | Perrin et al. | 219/121.52 |
| 6,028,395 A | * | 2/2000 | Holland et al. | 315/111.51 |

* cited by examiner

Primary Examiner—Mark Paschall
(74) Attorney, Agent, or Firm—Armstrong, Westerman, & Hattori, LLP

(57) ABSTRACT

A plurality of electrode bars are arranged in parallel with each other, and side electrode bars are connected to the corresponding opposite ends of the electrode bars, thereby forming a ladder-like RF discharge electrode. Power supply points are arranged axisymmetrically with respect to a reference line, which is a bisector which bisects one side of the RF discharge electrode, while being spaced a predetermined distance from the reference line, thereby suppressing voltage distribution on the ladder electrode, which has an effect on uniformity of discharge distribution, to a sufficiently low level of nonuniformity. Thus, uniform distribution of film deposition rate can be obtained, thereby enabling uniform deposition even in large-area applications.

18 Claims, 27 Drawing Sheets

DISCHARGE ELECTRODE, RF PLASMA GENERATION APPARATUS USING THE SAME, AND POWER SUPPLY METHOD

BACKGROUND OF THE INVENTION

1. Field of the Invention

The present invention relates to the form of a discharge electrode and a power supply method employed by an RF plasma generation apparatus for use in forming semiconductor films of amorphous silicon, microcrystalline silicon, polycrystalline silicon, silicon nitride, etc. to be used in solar cells, thin-film transistors, etc. as well as for use in etching such semiconductor films.

2. Description of the Related Art

As examples of the RF plasma generation apparatus, there will be described two structures used in a plasma-enhanced chemical vapor deposition apparatus (hereinafter called "PCVD" or a "vapor deposition apparatus") used conventionally to form thin films of amorphous silicon (hereinafter called "a-Si") and thin films of silicon nitride (hereinafter called "SiNx"); i.e., ① a structure using a ladder electrode for exciting discharge; and ② a structure using a parallel-plate electrode for exciting discharge.

① First, the structure using a ladder electrode is described. Japanese Patent Application Laid-Open (kokai) No. 236781/1992 discloses a plasma-enhanced CVD apparatus which uses a ladder-like flat coil electrode assuming any of various shapes. A typical example of this strucutre will be described with reference to FIG. 21.

As shown in FIG. 21, in this PCVD apparatus, a discharge-exciting ladder electrode (may hereinafter be called a "ladder electrodes") 02 and a substrate heater 03 are arranged in parallel with each other within a reaction chamber 01. An RF power of, for example, 13.56 MHz is supplied to the discharge-exciting ladder electrode 02 from an RF power source 04 via an impedance-matching unit 05.

As shown in FIG. 22 showing a perspective view of the discharge-exciting ladder electrode 02, the RF power source 04 is connected to one end of the ladder electrode 02 via the impedance-matching unit 05, whereas a grounding line 06 is connected to the other end of the ladder electrode 02, whereby the ladder electrode 02 is grounded, together with the reaction chamber 01 shown in FIG. 21.

RF power supplied to the discharge-exciting ladder electrode 02 causes generation of glow discharge plasma between the substrate heater 03 and the discharge-exciting ladder electrode 02, which are disposed within the reaction chamber 01. Then, the supplied RF power flows to the ground through the grounding line 06 of the discharge-exciting ladder electrode 02. A coaxial cable is used as the grounding line 06.

A reaction gas 08; for example, a mixed gas of monosilane and hydrogen, is supplied to the reaction chamber 01 from unillustrated cylinders through a reaction gas feed pipe 07. The supplied reaction gas 08 is decomposed by glow discharge plasma generated by the discharge-exciting ladder electrode 02. The resulting substance is deposited on a substrate 09, which is held on the substrate heater 03 and is heated to a predetermined temperature. The gas within the reaction chamber 01 is evacuated therefrom through an evacuation pipe 010 and by means of a vacuum pump 011.

Next will be described formation of a thin film on a substrate effected by use of the above-described apparatus. As shown in FIG. 21, the vacuum pump 011 is driven so as to evacuate the reaction chamber 01. Subsequently, the reaction gas 08; for example, a mixed gas of monosilane and hydrogen, is supplied to the reaction chamber 01 through the reaction gas feed pipe 07 so as to maintain the pressure within the reaction chamber 01 at 0.05 to 0.5 Torr.

In this state, RF power is applied to the discharge-exciting ladder electrode 02 from the RF power source 04 to thereby generate glow discharge plasma. The reaction gas 08 is decomposed by glow discharge plasma generated between the discharge-exciting ladder electrode 02 and the substrate heater 03. As a result, radicals including Si, such as $SiH_3$ and $SiH_2$, are generated and adhere to the surface of the substrate 09, thereby forming an a-Si thin film.

② Next, the structure using a parallel-plate electrode for exciting discharge will be described with reference to FIG. 23.

As shown in FIG. 23, an RF electrode 022 and a substrate heater 023 are arranged in parallel with each other within a reaction chamber 021. An RF power of, for example, 13.56 MHz is supplied to the RF electrode 022 from an RF power source 024 via an impedance-matching unit 025. The substrate heater 023, together with the reaction chamber 021, is grounded, thereby serving as a grounding electrode. Accordingly, glow discharge plasma is generated between the RF electrode 022 and the substrate heater 023.

A reaction gas 027; for example, a mixed gas of monosilane and hydrogen, is supplied to the reaction chamber 021 from unillustrated cylinders through a reaction gas feed pipe 026. The gas within the reaction chamber 021 is evacuated therefrom through an evacuation pipe 028 and by means of a vacuum pump 029. A substrate 030 is held on the substrate heater 023 and is heated to a predetermined temperature.

Through use of the thus-configured apparatus, a thin film is formed in the following manner. As shown in FIG. 23, the vacuum pump 029 is driven so as to evacuate the reaction chamber 021. Next, the reaction gas 027; for example, a mixed gas of monosilane and hydrogen, is supplied to the reaction chamber 021 through the reaction gas feed pipe 026 so as to maintain the pressure within the reaction chamber 021 at 0.05 to 0.5 Torr. A voltage is applied to the RF electrode 022 from the RF power source 023 to thereby generate glow discharge plasma.

Monosilane gas contained in the reaction gas 027 supplied through the reaction gas feed pipe 026 is decomposed by glow discharge plasma generated between the RF electrode 022 and the substrate heater 023. As a result, radicals including Si, such as $SiH_3$ and $SiH_2$, are generated and adhere to the surface of the substrate 030, thereby forming an a-Si thin film.

However, the conventional structures ① and ② using a ladder electrode and a parallel-plate electrode, respectively, for exciting discharge involve the following problems:

① An electric field generated in the vicinity of the ladder electrode 02 shown in FIG. 21 causes decomposition of the reaction gas (for example, $SiH_4$) 08 into Si, SiH, $SiH_2$, $SiH_3$, H, $H_2$, etc., thereby forming an a-Si film on the surface of the substrate 09. However, when the frequency of the RF power source is increased from current 13.56 MHz to a frequency of 30 MHz to 300 MHz (very high frequency band (hereinafter called the VHF band)) in order to increase the film deposition rate in formation of the a-Si film, uniformity of electric-field distribution in the vicinity of the ladder electrode 02 is impaired, resulting in a significant impairment in thickness distribution of the a-Si film formed on the substrate 09.

FIG. 24 shows the relationship between plasma power-source frequency and film-thickness distribution (deviation from an average film thickness) in the case of film deposition on a substrate having an area of 30 cm×30 cm effected by use of the ladder electrode 02. Uniformity (within ±10%) of film-thickness distribution can be reliably maintained for a substrate size, or substrate area, of about 5 cm×5 cm to 20 cm×20 cm.

The structure using the ladder electrode 02 encounters difficulty in forming a uniform film through employment of the VHF band, for the following reason. As shown in Table 1, the wavelength of the VHF band ranges from 1 m to 10 m in vacuum, showing an order equivalent to that of the circuit size of the film-forming apparatus. The wavelength is shortened further in a distributed-constant line, such as the coaxial cable used to transmit power or the ladder electrode. In the case of the coaxial cable, the wavelength is shortened to 0.67 times that in vacuum. When reflections arise within the circuit due to impedance mismatch, standing waves are created such that nodes and antinodes thereof are spaced one-half line wavelength apart.

TABLE 1

Wavelengths at Major Frequencies

| Frequency (MHz) | Wavelength in vacuum (m) | Wavelength in coaxial cable (m) | Interval of nodes and antinodes of standing wave in coaxial cable (m) |
| --- | --- | --- | --- |
| 13.56 | 22.1 | 14.8 | 7.4 |
| 60 | 5.0 | 3.4 | 1.7 |
| 100 | 3.0 | 2.0 | 1.0 |
| 200 | 1.5 | 1.0 | 0.5 |

Thus, in the case of an electrode having a large area, due to voltage distribution which arises from the presence of standing waves, electric-field distribution in the vicinity of the electrode becomes nonuniform, resulting in nonuniform discharge distribution. This behavior is described in a first prior-art document (J. Appl. Phys. 54(8), 1983, p.4367). This document describes nonuniform discharge derived from one-dimensional standing-wave distribution. It is conceivable that such nonuniform discharge will arise for each electrode bar of a ladder electrode.

Since the grounding line 06 shown in FIG. 22 has a length substantially equal to a wavelength shown in Table 1, the grounding line 06 fails to yield a grounding effect, and instead serves as an open end in the case of one-fourth wavelength and as a short-circuit end in the case of one-half wavelength, thereby affecting voltage and current distributions.

Furthermore, when the VHF band is employed, voltage and current distributions which arise from stray capacitance generated between the electrode and a surrounding structure or between the electrode and a grounding plate and voltage and current distributions which arise from residual inductance along electrode bars become unignorable, resulting in worsened uniformity.

For example, an electrode bar on the order of tens of cm has an inductance of several nH, which corresponds to an impedance of several Ω at 100 MHz and thus is unignorable as compared with a plasma impedance of several Ω.

Furthermore, when the VHF band is employed, current is less likely to flow, due to the skin effect. At 100 MHz, resistance becomes about 0.5 Ω per meter, causing nonuniform discharge and current loss.

Since discharge becomes nonuniform for the reasons mentioned above, formation of a uniform film becomes difficult. Accordingly, an improvement in film deposition rate effected through an increase in the frequency of a plasma power-source is very difficult to implement in the case of a large-area substrate which is required for improvement in productivity and reduction in production cost.

Notably, since the film deposition rate in formation of an a-Si film is proportional to the square of plasma power-source frequency, studies on this subject are becoming active in scientific societies of relevant technological fields. However, no success is reported in application to manufacture of large-area substrates.

Conventionally, a source frequency of 13.56 MHz is employed in supply of power to the ladder electrode 02. In this case, connecting the core conductor of a commercially available coaxial cable to a ladder electrode bar by means of a screw raises no problem. However, in generation of plasma through employment of the VHF band, unnecessary, strong plasma is generated around the core conductor and the grounding shield of the coaxial cable.

Particularly, at high power, considerably strong plasma is generated locally. This plasma locally accelerates the film deposition rate in the vicinity of a power supply point, impairs film quality, or, in some cases, causes generation of powder.

② An electric field generated between the RF electrode 022 and the substrate heater 023 shown in FIG. 23 causes decomposition of the reaction gas (for example, $SiH_4$) into Si, SiH, $SiH_2$, $SiH_3$, H, $H_2$, etc., thereby forming an a-Si film on the surface of the substrate 030. However, when the frequency of the RF power source 024 is increased from conventionally-employed 13.56 MHz to the VHF band in order to increase the film deposition rate in formation of the a-Si film, uniformity of electric-field distribution established between the RF electrode 022 and the substrate heater 023 is impaired, resulting in a significant impairment in thickness distribution of the a-Si film.

FIG. 24 is a characteristic graph showing the relationship between plasma power-source frequency and film-thickness distribution (deviation from an average film thickness) in the case of film formation on a substrate having an area of 30 cm×30 cm effected by use of the parallel-plate electrode 022. Uniformity (within ±10%) of film-thickness distribution can be reliably maintained for a substrate size, or substrate area, of about 5 cm×5 cm to 20 cm×20 cm.

The structure using a parallel-plate electrode encounters difficulty in forming a uniform film through employment of the VHF band, for the following reason. In contrast to a ladder electrode, a parallel-plate electrode has a structure which inherently makes difficult uniform supply of a reaction gas.

This problem is described in detail in a second prior-art document (Mat. Res. Soc. Symp. Proc, Vol. 219 (1991), p. 631). When the gas 027 is supplied through the reaction gas feed pipe 026 shown in FIG. 23, the film deposition rate differs between a portion of the surface of the substrate 030 located on the near side and a portion located on the far side with respect to the reaction gas feed pipe 026.

Even in the case of the strucure, not shown, in which a reaction gas is supplied through a number of holes formed in the RF electrode 022, nonuniform film-thickness distribution tends to result, due to a small diffusion volume of the gas.

Furthermore, as in the case of the ladder electrode, when the VHF band is employed, presence of standing waves has an adverse effect on voltage distribution, resulting in nonuniform discharge. In the ladder electrode, current flow is limited to the direction of an electrode bar, and terminal impedance is determined by the grounding line. By contrast, in the parallel-plate electrode, voltage distribution and current distribution are two-dimensional, and terminal impedance changes in a complicated manner, because the entire circumference of the electrode 22 serves as an end terminal. Thus, discharge distribution becomes nonuniform and, in some cases, varies with time.

In the ladder electrode, electric-field distribution for generating plasma is inherently nonuniform around an electrode bar. Thus, even when standing waves are present to some extent, their presence is not very influential. By contrast, in the parallel-plate electrode, since plasma is generated by means of uniform electric-field distribution, a slight disturbance in uniformity of electric field results in a significant impairment in uniformity of plasma.

Accordingly, an improvement in film deposition rate effected through an increase in the frequency of a plasma power-source is very difficult to implement when a large-area substrate is employed in order to improve productivity and reduce production cost. Notably, since the film deposition rate in formation of an a-Si film is proportional to the square of plasma power-source frequency, studies on this subject are becoming active in scientific societies of relevant technological fields. However, no success is reported in application to manufacture of large-area substrates.

A third prior-art document (L. Sansonnens, et.al, Plasma Sources Sci. Technol. 6(1997), p.170) reports formation of a large-area film effected by use of a parallel-plate electrode and through employment of the VHF band. This prior-art document reports that, when an RF power of 70 MHz is supplied to the center of the parallel-plate electrode, a nonuniformity of ±38% results. This is equivalent to our test results shown in FIG. 24. Nonuniformity of this level is too high to enable application of this method to manufacture of solar cells and thin-film transistors.

This document also reports that, when an RF power of 70 MHz is supplied to four points of the parallel-plate electrode, uniformity is improved to ±18%. However, uniformity of this level is still insufficient as compared with a uniformity of ±10% required for manufacture of solar cells.

In addition to the above-described ladder and parallel-plate electrodes, a grid-like (lattice-like or mesh-like) discharge electrode is proposed for use in a plasma-enhanced chemical vapor deposition apparatus. FIG. 25 schematically shows the configuration of this plasma-enhanced chemical vapor deposition apparatus using a grid-like RF discharge electrode.

As shown in FIG. 25, in a PCVD 031 are disposed a material gas feed member 035 having a gas inlet 034 for introducing a material gas 033 into a vacuum chamber 032; a substrate 037 supported by a substrate support means 036, which is arranged in opposition to the material gas feed member 035 and serves as a substrate heater; and a grid-like RF discharge electrode 038 disposed between the substrate 037 and the material gas feed member 035. In FIG. 25, reference numeral 039 denotes a vacuum pump, and reference numeral 040 denotes an RF power source.

Next will be described a method for forming an amorphous thin film and a microcrystalline thin film by use of the above-mentioned vapor deposition apparatus 031. The substrate (of, for example, glass, stainless steel, or heat-resistant polymeric material) 037 is fixedly attached to the substrate support means 036 serving as a substrate heater and is then heated to a predetermined temperature (for example, 200° C.). The vacuum chamber 032 is evacuated (to, for example, about $1 \times 10^{-6}$ Torr) by means of the vacuum pump 039.

Next, the material gas (for example, $SiR_4$ gas) is introduced into the vacuum chamber 032 through the material gas inlet 034. The feed rate and the evacuation rate are adjusted so as to establish a predetermined pressure within the vacuum chamber 032 and to obtain a predetermined pressure and flow rate of the material gas (for example, 800 sccm at 0.1 Torr).

Next, RF power (for example, 800 W at 60 MHz) is supplied to the RF discharge electrode 08 from the RF power source 040, thereby generating a plasma 041 of the material gas 032 around the RF discharge electrode 038. Being activated by the plasma 041, the material gas 033 enters a radical state (for example, $SiH_2$ and $SiH_3$, which will be hereinafter called radicals). Radicals which have reached the surface of the substrate 037 supported by the substrate support means 036 are deposited on the surface of the substrate 037 while combining chemically, thereby forming a thin film (of, for example, amorphous silicon or microcrystalline silicon).

In recent years, solar cells of amorphous silicon, solar cells of microcrystalline silicon, and liquid crystal displays using thin-film transistors have been urged to assume a large area. Thus, an apparatus for manufacturing the same; i.e., the PCVD apparatus, shows the same tendency toward an increase in the area of a thin film to be formed.

However, an increase in the area of a thin film to be formed involves difficulty in depositing a thin film uniformly (in terms of, for example, physical properties or thickness). Major causes of this difficulty are ① nonuniformity of flow rate distribution of gas to be introduced onto the surface of a substrate and ② nonuniformity of voltage distribution on the surface of a discharge electrode.

In order to improve the film deposition rate and film quality, the power source frequency shows a tendency toward increasing. Specifically, the frequency tends to be increased from conventionally-employed 13.56 MHz to a higher frequency band (for example, 40 MHz to 200 MHz). Since wavelengths of this frequency band are of equivalent order to the size of a substrate, the presence of standing waves has an adverse effect on voltage distribution on the surface of the electrode, resulting in more marked nonuniformity of the voltage distribution and thus hindering uniform film formation over a large area.

FIG. 26 exemplifies the forms and arrangement of a material gas feed pipe 051, an RF discharge electrode 052, and a substrate 053 employed in a conventional plasma-enhanced chemical vapor deposition apparatus in order to enhance uniformity of flow-rate distribution of a supplied gas. As shown in FIG. 26, in order to feed a material gas over the entire surface of the substrate 053, the material gas feed pipe 051 is configured such that gas pipes 055, each having gas outlets 054 formed therein, are arranged in the form of a ladder and in parallel with the substrate 053.

Also, in order to generate plasma over the entire surface of the substrate 053 and not to interrupt the flow of the material gas from the gas feed pipe 051 for uniform feed of the same, the RF discharge electrode 052 is configured such that electrode bars 056 are arranged in the form of a ladder and in parallel with the substrate. As shown in FIG. 26, a power supply point 057 is located at a central portion of the RF discharge electrode 052.

As compared with an apparatus using a conventional parallel-plate electrode, the apparatus shown in FIG. 26 can improve uniformity of flow rate distribution of the supplied gas and thus has exhibited good uniformity of film thickness in depositing a large-area film at a conventional source frequency of 13.56 MHz.

However, when a source frequency falling within a frequency band higher than the conventional source frequency is used in order to form a high-quality film at higher speed, the prior-art form of an RF discharge electrode tends to involve nonuniform voltage distribution, thus encountering difficulty in generating plasma uniformly over the entirety of the RF discharge electrode.

FIG. 27 shows voltage distribution as observed when the RF discharge electrode 052 is used. As shown in FIG. 27, voltage distribution is nonuniform such that voltage corresponding to the electrode bar 056 having the power supply point 057 at a central portion thereof is relatively high, indicating that plasma is generated in a nonuniform manner.

As mentioned previously, according to the third prior-art document, in the parallel-plate PCVD apparatus, power is supplied to the center on the surface of the electrode or to four points arranged on the surface of the electrode symmetrically with respect to the center, whereby relatively uniform voltage distribution is obtained even at a source frequency of 70 MHz. However, even this prior-art apparatus exhibits a high film-thickness nonuniformity of ±18%, failing to obtain a sufficiently uniform thin film (within ±10%). Thus, there has been demand for a PCVD apparatus capable of obtaining a uniform thin film.

SUMMARY OF THE INVENTION

In view of the above-mentioned problems, an object of the present invention is to provide an RF discharge electrode capable of forming an amorphous thin film of a uniform thickness and a microcrystalline thin film of a uniform thickness, as well as to provide a plasma vapor deposition apparatus using the same.

To achieve the above object, the present invention provides an RF discharge electrode of an RF plasma generation apparatus to which power is supplied from an RF power source through a matching unit, wherein the discharge electrode has at least two RF power supply points. Thus, voltage distribution on the ladder electrode, which has an effect on uniformity of discharge distribution on the surface of a substrate, can be suppressed to a sufficiently low level of nonuniformity, thereby obtaining uniform film deposition rate distribution.

Preferably, two groups of electrode bars, each group comprising a plurality of parallel electrode bars, are arranged perpendicular to each other; and the RF power supply points are arranged axisymmetrically with respect to a bisector which bisects sides of the RF discharge electrode. Thus, voltage distribution on the ladder electrode, which has an effect on uniformity of discharge distribution on the surface of a substrate, can be suppressed to a sufficiently low level of nonuniformity, thereby obtaining uniform film deposition rate distribution.

The present invention also provides an RF plasma generation apparatus in which the discharge electrode of the present invention and substrate support means are disposed in parallel with each other within a reaction chamber, and RF power is supplied to the discharge electrode from an RF power source through a matching unit. Thus, voltage distribution on the ladder electrode, which has an effect on uniformity of discharge distribution on the surface of a substrate, can be suppressed to a sufficiently low level of nonuniformity, thereby enabling uniform deposition even when the area of the substrate increases.

Preferably, the power supply portion is located in a peripheral portion of the discharge electrode which does not face a substrate. Thus, voltage distribution on the ladder electrode, which has an effect on uniformity of discharge distribution on the surface of the substrate, can be suppressed to a sufficiently low level of nonuniformity, thereby enabling uniform deposition even when the area of the substrate increases.

Preferably, power transmission lines extending from the matching unit to the corresponding power supply points are of the same length. Thus, the same phase of RF voltage can be established at the power supply points, thereby preventing occurrence of unstable, inconsistent standing waves and enabling fine adjustment of the positions of the power supply points with relative ease in pursuit of uniform film deposition rate distribution.

Preferably, the transmission line is connected to the power supply portion of the discharge electrode such that an uninsulated bare metallic connector for connecting the power supply point and a power line of the transmission line has a diameter at least equal to that of the electrode bar as measured in the vicinity of the power supply portion. Thus, generation of intense discharge resembling corona discharge around the core conductor and around a shield can be eliminated, thereby preventing impairment in film deposition rate distribution and generation of powder.

Preferably, the distance between the power supply point and a metallic terminal member of a grounding line of the transmission line is at least 1 cm. Thus, generation of intense discharge resembling corona discharge around the core conductor and around a shield can be eliminated, thereby preventing impairment in film deposition rate distribution and generation of powder.

Preferably, the transmission line is attached to the discharge electrode from opposite the substrate at an angle of at least 45° with respect to the discharge electrode. Thus, generation of intense discharge resembling corona discharge around the core conductor and around a shield can be eliminated, thereby preventing impairment in film deposition rate distribution and generation of powder.

Preferably, the shortest distance between a metallic portion of the power line of the transmission line and a grounded member is at least 1 cm. Thus, generation of intense discharge resembling corona discharge around the core conductor and around a shield can be eliminated, thereby preventing impairment in film deposition rate distribution and generation of powder.

Preferably, the metallic connector of the power supply portion of the discharge electrode is covered by an insulator having an outside diameter of 10 mm to 40 mm. Thus, plasma can be eliminated completely from around the metallic connector, thereby preventing impairment in uniformity of film deposition rate distribution.

Preferably, a gap between an outer circumferential surface of the metallic connector and an inner circumferential surface of the insulator is not greater than 3 mm. Thus, generation of plasma within the gap can be prevented.

Preferably, a structure for power supply to the discharge electrode is an insulated structure such that the transmission line is connected to the discharge electrode by means of a connector and a receptacle in such a manner that a radial gap between an external shield and a core conductor within the interior of the connected connector and receptacle is not greater than 3 mm. Since current is less likely to flow through an insulator in a DC electric field, discharge current is suppressed, thereby retarding occurrence of discharge.

The present invention further provides an RF plasma generation apparatus in which a discharge electrode and substrate support means are disposed in parallel with each other within a reaction chamber, and RF power is supplied to the discharge electrode from an RF power source through a matching unit. The number and position of power supply points are determined such that the shortest distance as measured along an electrode between at least one of the power supply points and any point located within a portion of a surface of the discharge electrode which faces a substrate is not greater than one-fourth of the in-vacuum wavelength of the RF power. Thus, voltage distribution on the ladder electrode, which has an effect on uniformity of discharge distribution on the surface of a substrate, can be suppressed to a sufficiently low level of nonuniformity, thereby obtaining uniform film deposition rate distribution.

The present invention further provides an RF plasma generation apparatus in which a discharge electrode and substrate support means are disposed in parallel with each other within a reaction chamber, and RF power is supplied to the discharge electrode from an RF power source through a matching unit. In order to supply RF power to a plurality of points on the discharge electrode, the RF plasma generation apparatus comprises, as a power transmission line, a first coaxial cable for receiving an output from the RF power source and having two divided ends; two second coaxial cables connected to the divided ends of the first coaxial cable, each of the second coaxial cables having a length equal to one-fourth of an in-cable wavelength of the RF power and a characteristic impedance equal to that of the first coaxial cable, and having two divided ends; and two third coaxial cables connected to the divided ends of each of the second coaxial cables, each of the third coaxial cables having a characteristic impedance equal to that of the first coaxial cable. Thus, a portion of power supplied from the RF generator which is lost in the course of transmission through the transmission line decreases, thereby increasing a portion of power to be used to generate plasma.

Preferably, the coaxial cable serves as a distributed constant line. Thus, a portion of power supplied from the RF power source which is lost in the course of transmission through the transmission line decreases, thereby increasing a portion of power to be used to generate plasma.

The present invention further provides a power supply method for an RF plasma generation apparatus in which a ladder-type or grid-type discharge electrode and substrate support means are disposed in parallel with each other within a reaction chamber and in which RF power is supplied to the discharge electrode from an RF power source through a matching unit. Two or more power supply points are employed for supply of power. Thus, voltage distribution on the ladder electrode, which has an effect on uniformity of discharge distribution on the surface of a substrate, can be suppressed to a sufficiently low level of nonuniformity, thereby obtaining uniform film deposition rate distribution.

Preferably, the number and position of the power supply points are determined such that the shortest distance as measured along an electrode between at least one of the power supply points and any point located within a portion of a surface of the discharge electrode which faces a substrate is not greater than one-fourth of the in-vacuum wavelength of the RF power. Thus, voltage distribution on the ladder electrode, which has an effect on uniformity of discharge distribution on the surface of a substrate, can be suppressed to a sufficiently low level of nonuniformity, thereby obtaining uniform film deposition rate distribution.

Preferably, in order to supply RF power to a plurality of points on the discharge electrode, as a power transmission line, a first coaxial cable having two divided ends is provided in order to receive an output from the RF power source; two second coaxial cables each having two divided ends are connected to the divided ends of the first coaxial cable, each of the second coaxial cables having a length equal to one-fourth of an in-cable wavelength of the RF power and a characteristic impedance equal to that of the first coaxial cable; and two third coaxial cables each having a characteristic impedance equal to that of the first coaxial cable are connected to the divided ends of each of the second coaxial cables. Thus, a portion of power supplied from the RF power source which is lost in the course of transmission through the transmission line decreases, thereby increasing a portion of power to be used to generate plasma.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which:

FIG. 12 is a diagram showing voltage distribution as observed when the electrode according to the fifth embodiment is used;

DESCRIPTION OF THE MODE FOR CARRYING OUT THE INVENTION

Modes for carrying out the present invention will next be described. However, the present invention is not limited thereto.

[First Mode for Carrying out the Invention]

Figure 1:
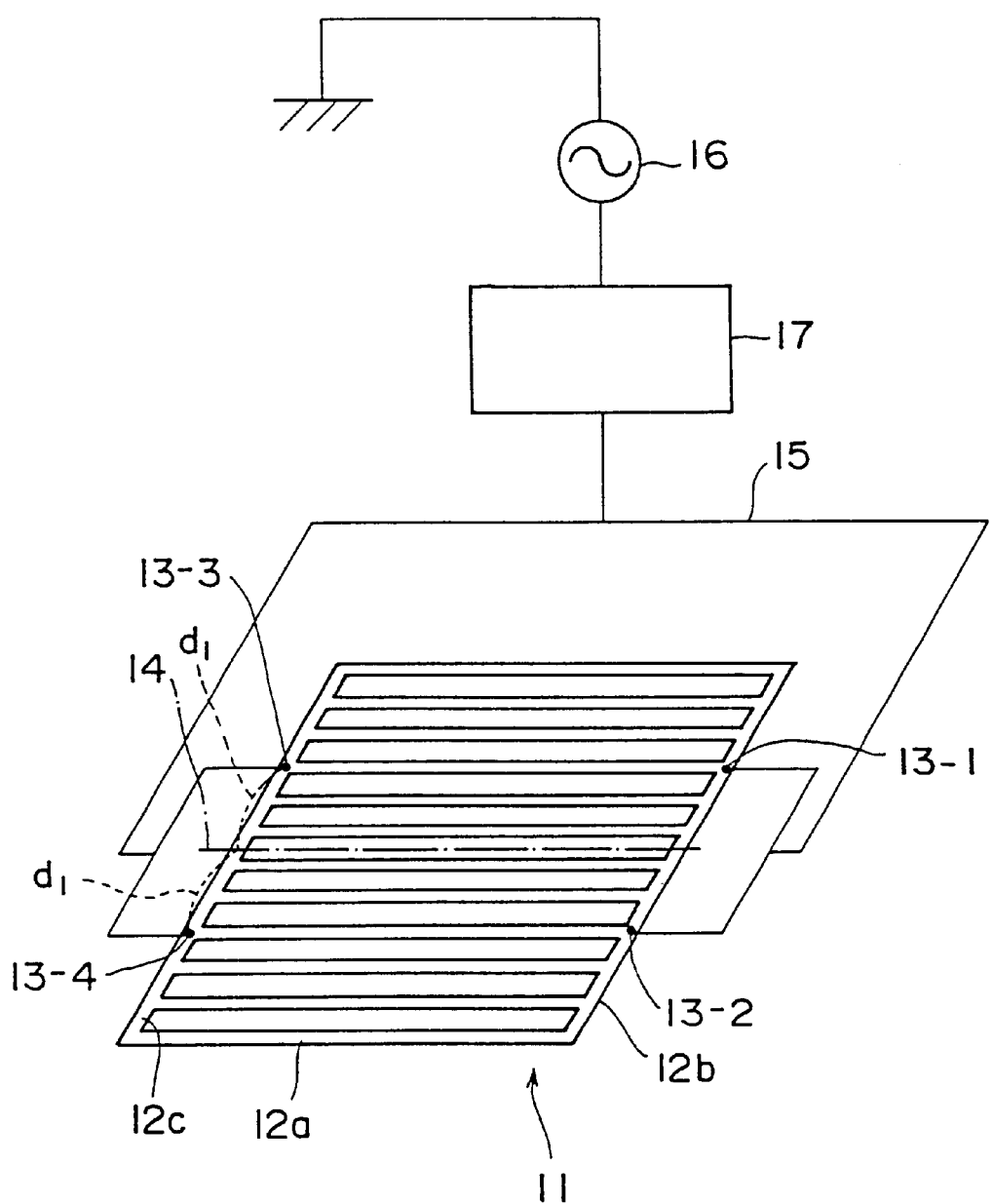
FIG. 1 is a perspective view of an RF discharge electrode of a plasma-enhanced vapor deposition apparatus according to a first embodiment of the present invention.

FIG. 1 shows in detail a power supply portion of a ladder electrode according to a first mode for carrying out the invention and exemplifies multipoint power supply, in which power is supplied to at least two points on the ladder electrode. As shown in FIG. 1, a ladder electrode 11 of a vapor deposition apparatus according to the present mode is configured such that a plurality of electrode bars 12a are arranged in parallel with each other, and electrode bars 12b and 12c are connected to the corresponding opposite ends of the electrode bars 12a, thereby forming a ladder-like electrode; and power supply points 13 (13-1 to 13-4) are arranged axisymmetrically with respect to a reference line 14, which is a bisector which bisects one side of the RF discharge electrode 11, while being spaced a predetermined distance from the reference line 14. A coaxial cable 15 is used as a power transmission line. RF power is supplied to the power supply points 13-1 to 13-4 from an RF power source 16 through the coaxial cable 15 and a matching unit 17. The RF power source 16 supplies power to the four power supply points 13. (13-1 to 13-4) on the ladder electrode 11 through the matching unit 17 and the coaxial cable 15.

① In a plasma generation apparatus using the ladder electrode 11, the number of the power supply points 13 on the ladder electrode 11 is 2 or more, preferably 4 or more.

② In the plasma generation apparatus described in ②, the number and position of the power supply points are determined such that the shortest distance as measured along a metallic component bar of the ladder electrode 11 between at least one of the power supply points and any point located within a portion of the surface of the ladder electrode 11 which faces a substrate, preferably any point on the surface of the ladder electrode 11, is not greater than one-fourth, preferably not greater than one-eighth, of the in-vacuum wavelength of the RF power. As a result, voltage distribution on the ladder electrode 11, which has an effect on uniformity of discharge distribution on the surface of the substrate, can be suppressed to a sufficiently low level of nonuniformity. Thus, uniform distribution of film deposition rates can be obtained.

③ In the plasma generation apparatus described in ①, the power supply points 13 are located on the ladder electrode 11 in such a manner as not to face the substrate; i.e., the power supply points 13 are located at a peripheral portion of the ladder electrode 11. Particularly preferably, the power supply points 13 are located at a frame portion of the ladder electrode 11, for the following reason.

When, for example, the coaxial cable 15 is used as a power transmission line (hereinafter called a "transmission line") for supplying power to the power supply points 13, plasma is generated around the coaxial cable 15 as well as around the ladder electrode 11. This plasma causes decomposition of monosilane, thereby generating radicals, such as $SiH_3$, which are deposited to form an amorphous silicon film. Thus, the film deposition rate at a portion of the surface of the substrate in the vicinity of the power supply portion becomes higher than that at the remaining portion.

Therefore, the power supply points 13 are located at a peripheral portion of the ladder electrode, which portion does not face the substrate 25, so that film deposition rate distribution avoids influence of plasma generated in the vicinity of the power supply portion.

④ In the plasma generation apparatus described in ①, power transmission lines extending from the matching unit 17 to the power supply points 13 are of the same length, thereby establishing the same phase of RF voltage at the power supply points and thus preventing occurrence of unstable, inconsistent standing waves. Thus, the positions of the power supply points can be finely adjusted with relative ease in pursuit of uniform film deposition rate distribution.

⑤ In the plasma generation apparatus described in ①, the power supply points 13 are arranged axisymmetrically with respect to a reference line 14 passing the center of the ladder electrode 11, while being located a predetermined distance ($d_1$) away from the reference line 14. Thus, voltage distribution on the ladder electrode 11 becomes symmetrical, thereby facilitating fine adjustment of the positions of the power supply points for higher uniformity of film deposition rate distribution. Alternatively, the power supply points 13 may be arranged point-symmetrically (power supply points 13-1 and 13-4).

Embodiments of the present mode will be described in detail in the sections of first through sixth embodiments.

[Second Mode for Carrying out the Invention]

Figure 15:
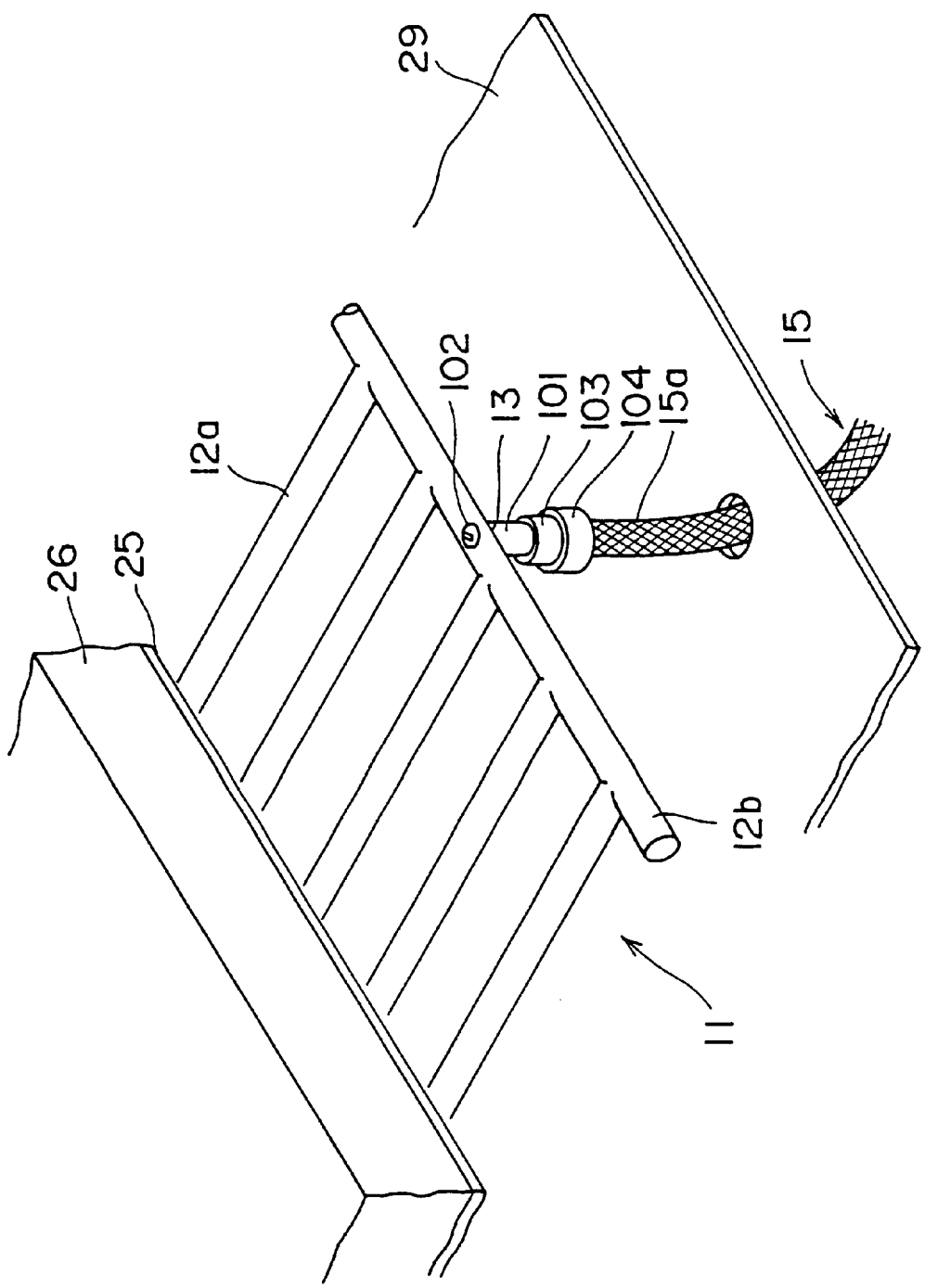
FIG. 15 is a detailed view of an embodiment of a power supply portion of a ladder electrode according to a seventh embodiment.
Figure 16:
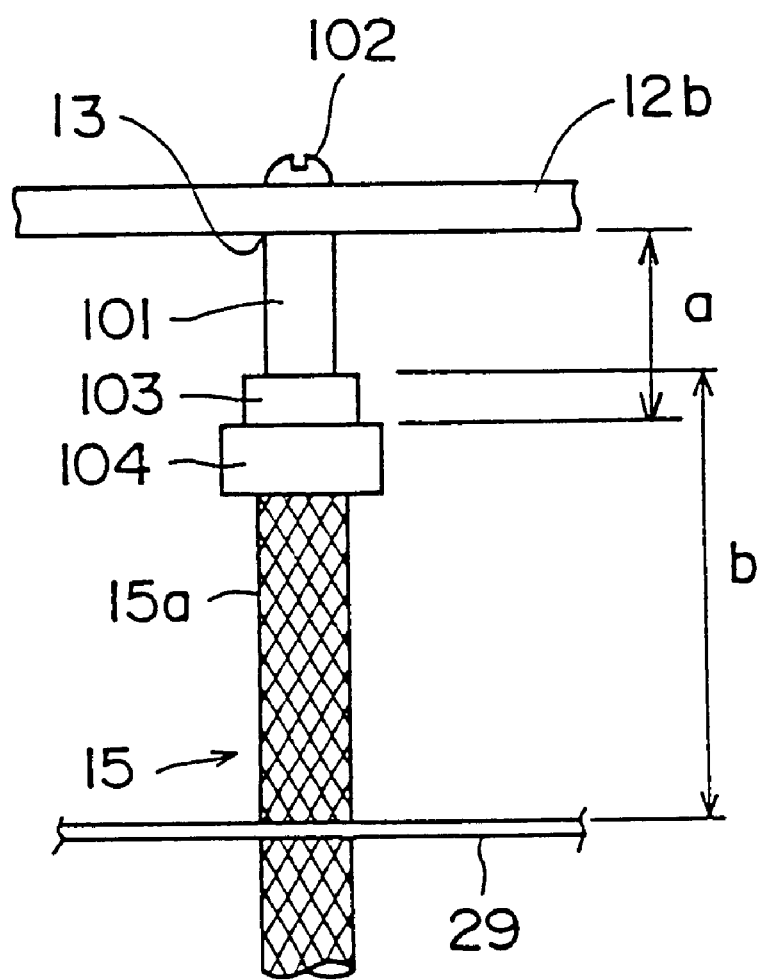
FIG. 16 is a side view showing a main portion of the power supply portion of FIG. 15.

FIG. 15 shows in detail a power supply portion of a ladder electrode according to a second mode for carrying out the invention. FIG. 16 is a side view showing a main portion of the power supply portion.

① In a film deposition apparatus using plasma generated at VHF band frequency, the transmission line (for example, the coaxial cable 15) is connected to a power supply portion of the ladder electrode 11 such that an uninsulated bare metallic connector 101 for connecting the power supply point 13 on the ladder electrode 11 and a power line (for example, the core conductor of the coaxial cable 15) of the transmission line (for example, the coaxial cable 15) has a diameter at least equal to that of the electrode bar 12a as measured in the vicinity of the power supply portion, preferably a greater diameter, as represented by the metallic connector 101 in FIG. 16.

Employment of this metallic connector 101 eliminates generation of intense discharge resembling corona discharge around the core conductor and around a shield, thereby preventing impairment in film deposition rate distribution and generation of powder.

② Distance (a) between the power supply point 13 and a metallic terminal member 104 of a grounding line (for example, a grounding shield 15a of the coaxial cable 15) of the transmission line (for example, the coaxial cable 15) is at least 1 cm, preferably 2 cm or more.

Establishment of this distance (a) eliminates generation of intense discharge resembling corona discharge around the core conductor and around the shield, thereby preventing impairment in film deposition rate distribution and generation of powder.

③ The transmission line (for example, the coaxial cable 15) is attached to the ladder electrode 11 from opposite the substrate (attached to the back side of the ladder electrode 11) at an angle of at least 45° with respect to the ladder electrode 11, preferably perpendicularly (90°) as shown in FIG. 16.

This form of attachment eliminates generation of intense discharge resembling corona discharge around the core conductor and around the shield, thereby preventing impairment in film deposition rate distribution and generation of powder.

④ The shortest distance (b) between the power line of the transmission line (for example, the core conductor of the coaxial cable 15) or an uninsulated bare portion of the metallic connector 101, and the grounding shield 15a or a grounded part, such as a discharge chamber, is at least 1 cm, preferably 2 cm or more.

Establishment of this distance (b) eliminates generation of intense discharge resembling corona discharge around the core conductor and around the shield, thereby preventing impairment in film deposition rate distribution and generation of powder.

An embodiment of the present mode will be described in detail in the section of seventh embodiment.

[Third Mode for Carrying out the Invention]

Figure 17:
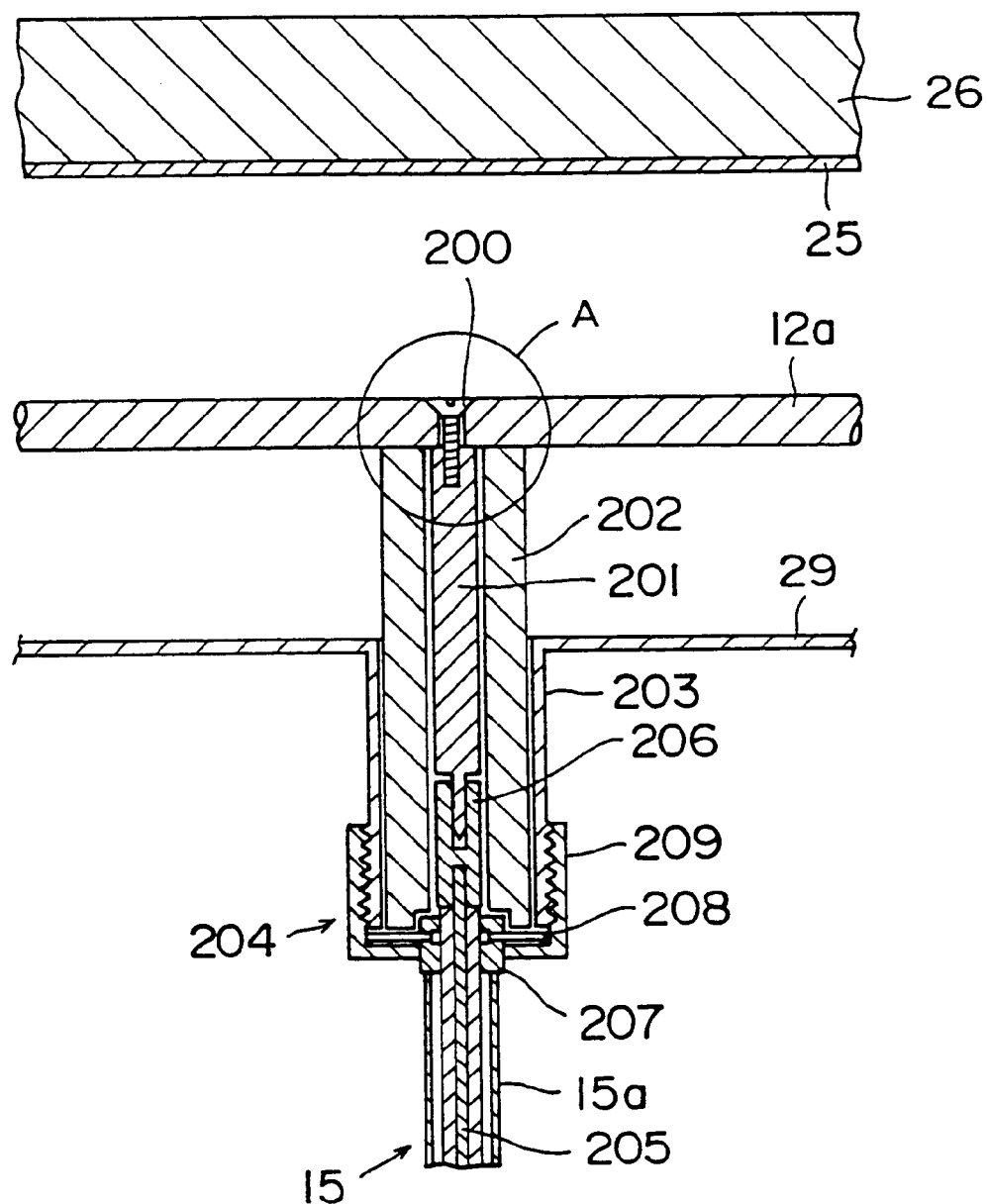
FIG. 17 is a sectional view of an embodiment of a power supply portion of a ladder electrode according to an eighth embodiment.
Figure 18:
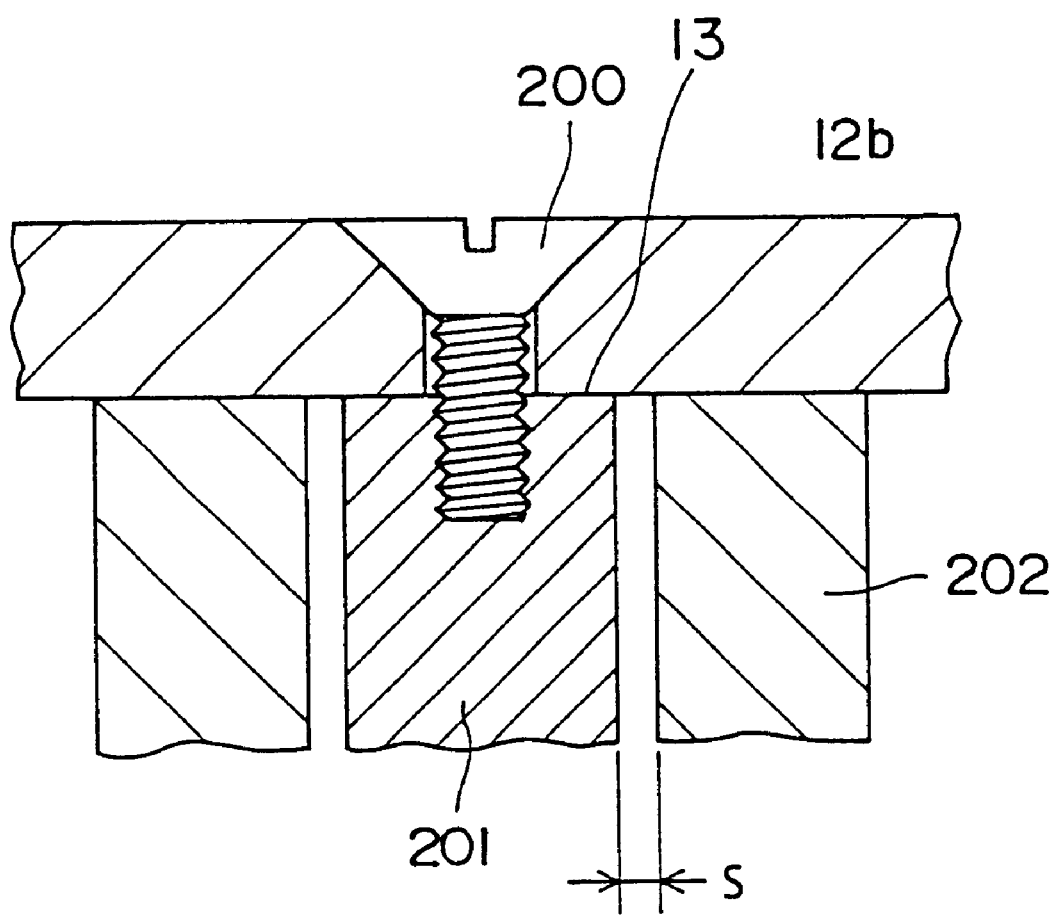
FIG. 18 is an enlarged view of portion A of FIG. 17.

FIG. 17 is a sectional view showing a power supply portion of a ladder electrode according to a third mode for carrying out the invention. FIG. 18 is an enlarged view of portion A.

① A metallic connector 201 of the power supply portion 13 of the ladder electrode 11 is covered by an insulator 202 having an outside diameter of 10 mm to 40 mm, preferably 15 mm to 30 mm.

The insulator 202 disposed around the metallic connector 201 of the power supply portion completely eliminates plasma from around the metallic connector 201, thereby preventing impairment in uniformity of film deposition rate distribution.

② In the structure described in ①, a gap (s) between the outer circumferential surface of the metallic connector 201 and the inner circumferential surface of the insulator 202 is not greater than 3 mm, preferably not greater than 1 mm. Since the gap (s) between the core conductor and the inner circumferential surface of the insulator 202 serving as an external shield is narrow, generation of plasma within the gap can be prevented.

③ A structure for power supply to the ladder electrode 11 is configured such that the transmission line is connected to the ladder electrode 11 by means of a connector and a receptacle. An insulator is inserted into the connector-receptacle structure such that a radial gap between an external shield and a core conductor within the interior of the connection of the connector and the receptacle is not greater than 3 mm, preferably not greater than 1 mm. This structure eliminates space where discharge might otherwise be excited, thereby reducing susceptibility to discharge.

An embodiment of the present mode will be described in detail in the section of eighth embodiment.

[Fourth Mode for Carrying out the Invention]

Figure 19:
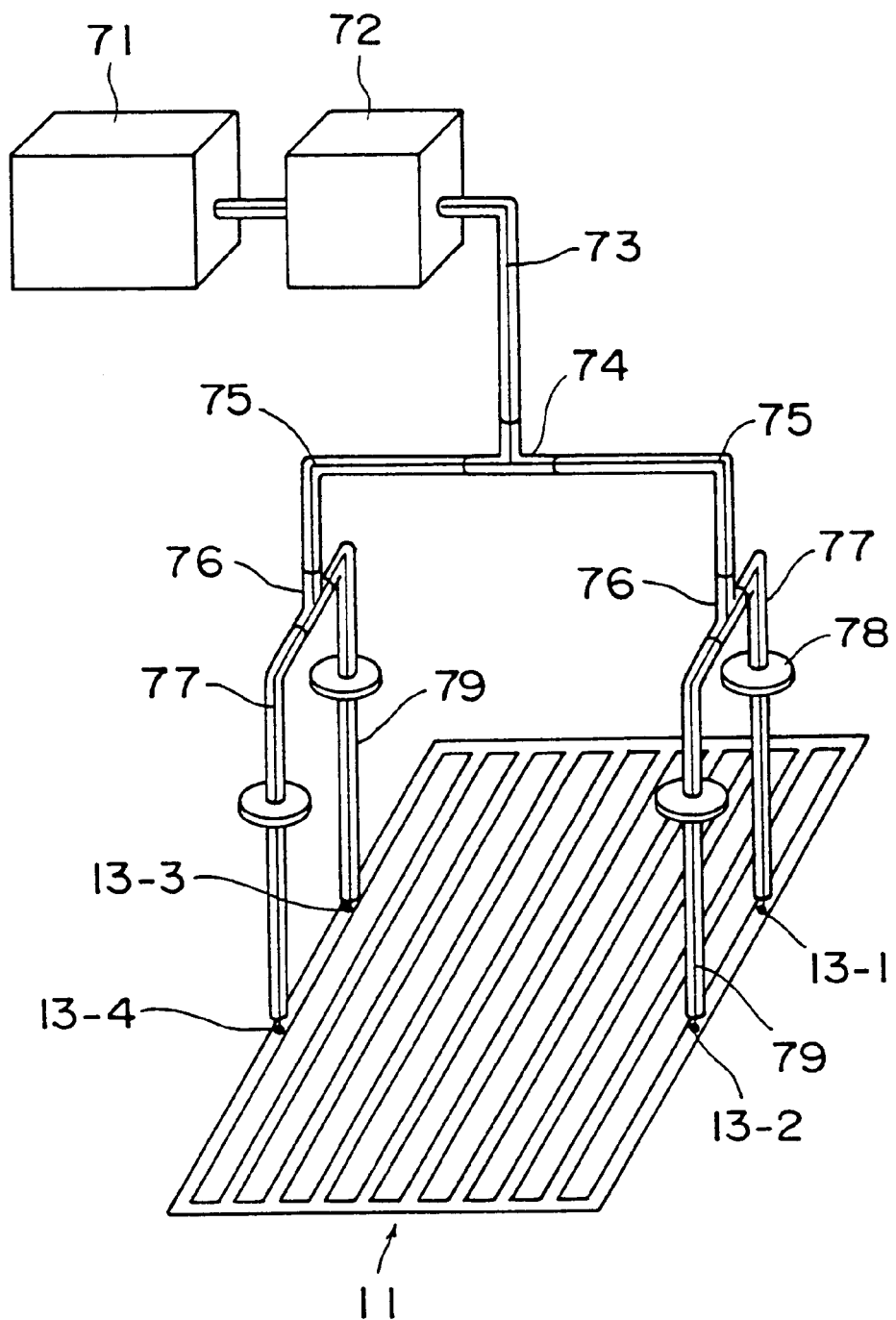
FIG. 19 is a conceptual view showing a power-dividing method of a ninth embodiment.
Figure 20:
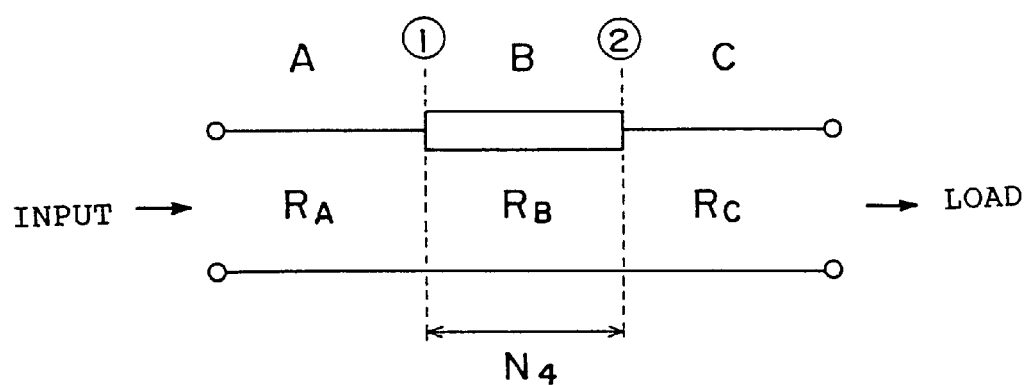
FIG. 20 is a conceptual diagram showing the effect of the ninth embodiment.
Figure 21:
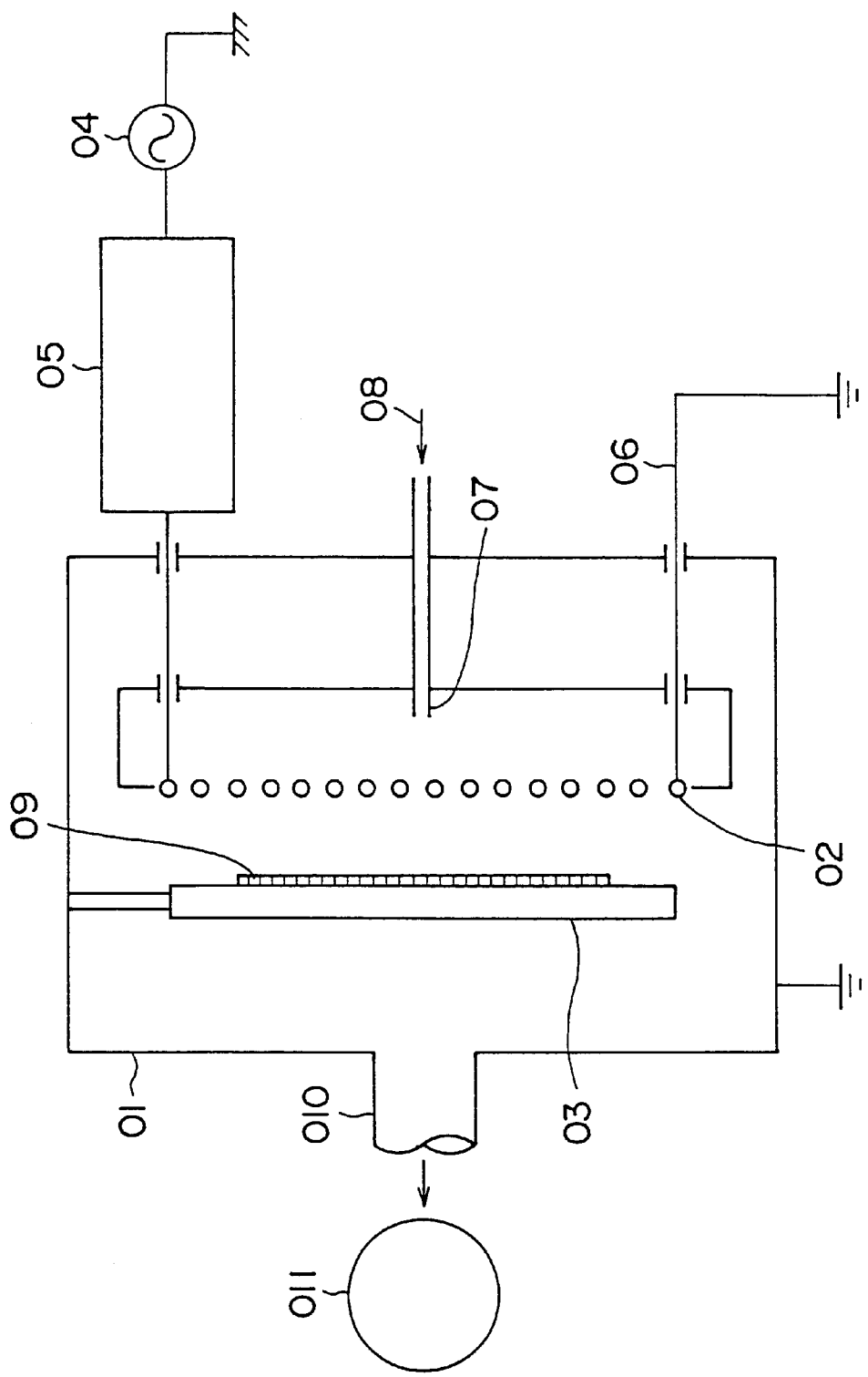
FIG. 21 is a schematic diagram of a plasma-enhanced CVD apparatus.
Figure 22:
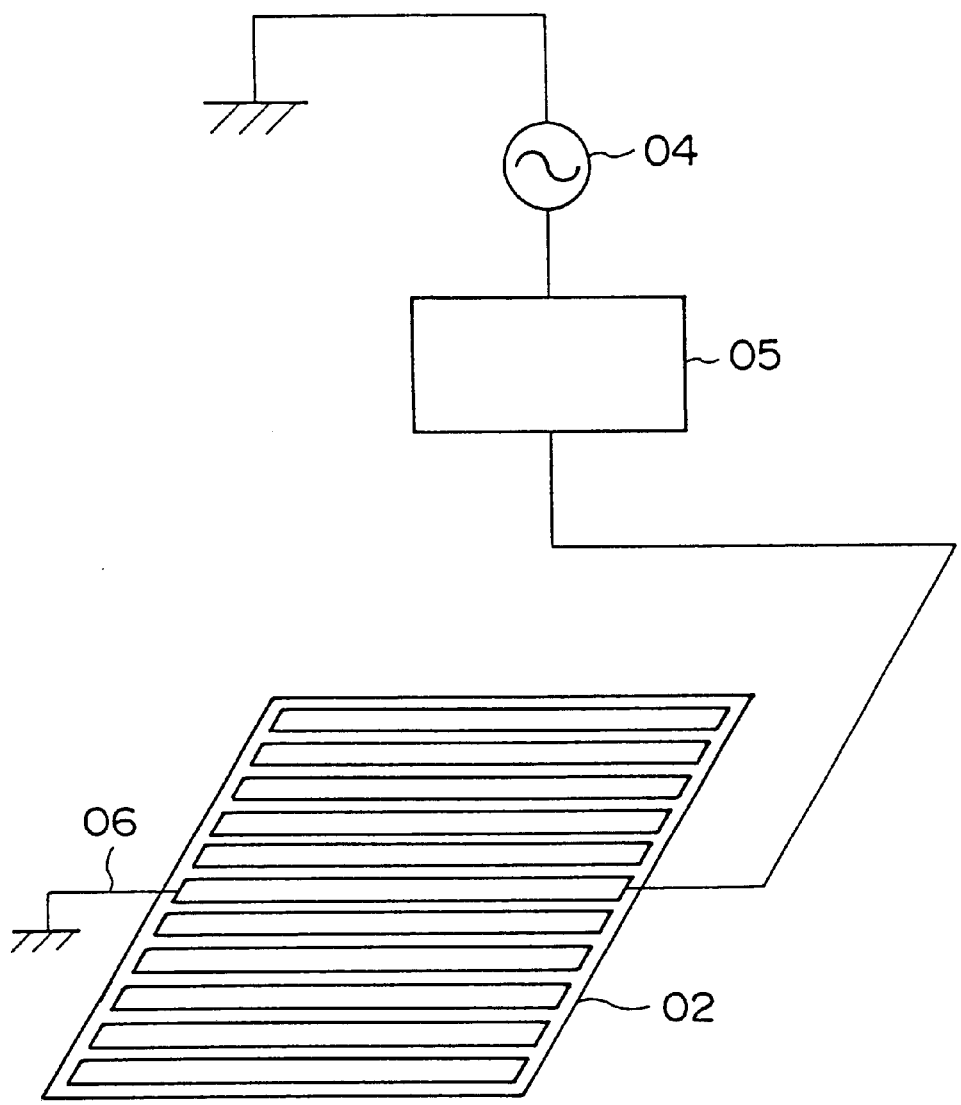
FIG. 22 is a perspective view of a conventional ladder discharge electrode.
Figure 23:
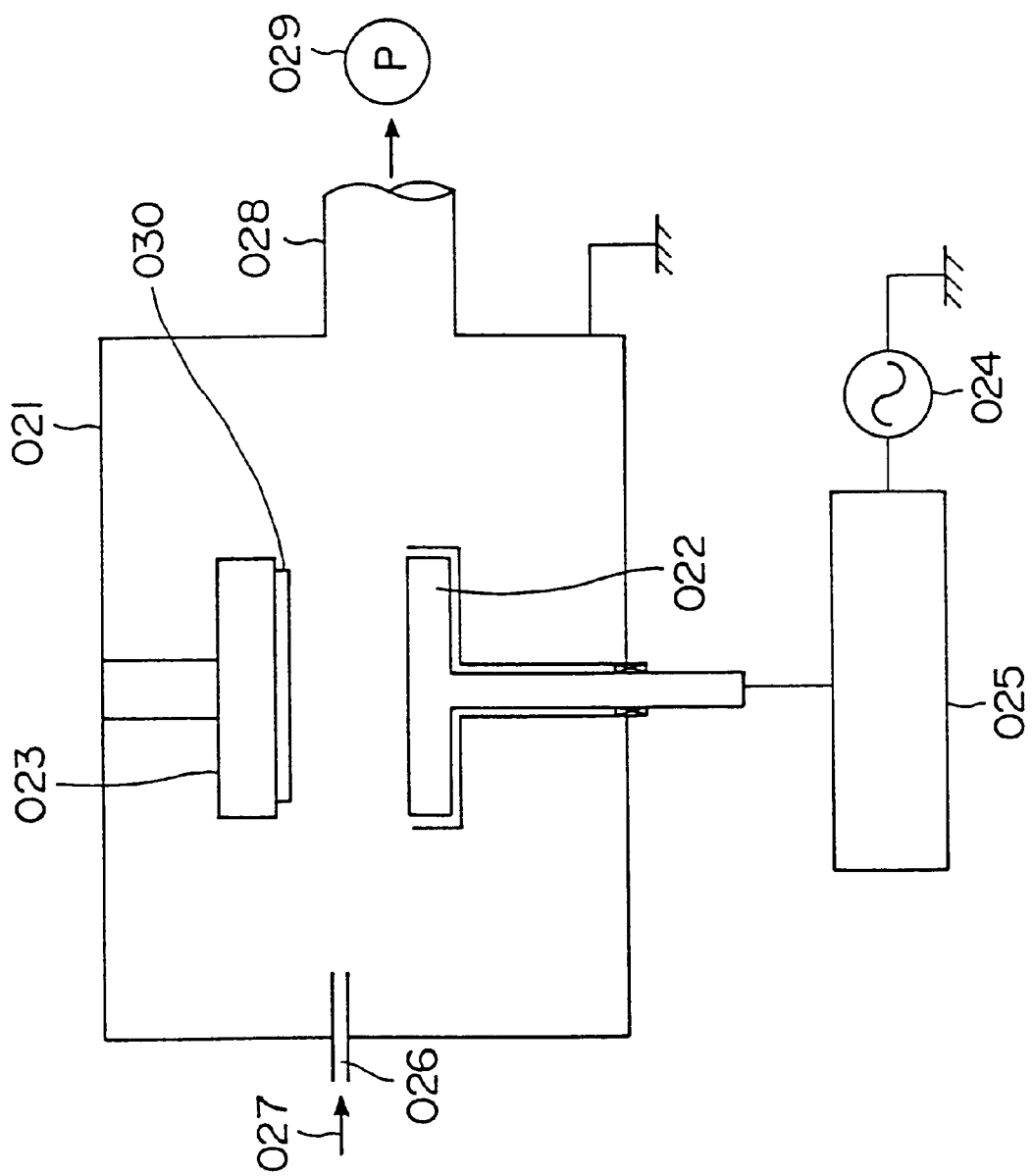
FIG. 23 is a schematic diagram of a plasma-enhanced CVD apparatus using a conventional parallel-plate discharge electrode.
Figure 24:
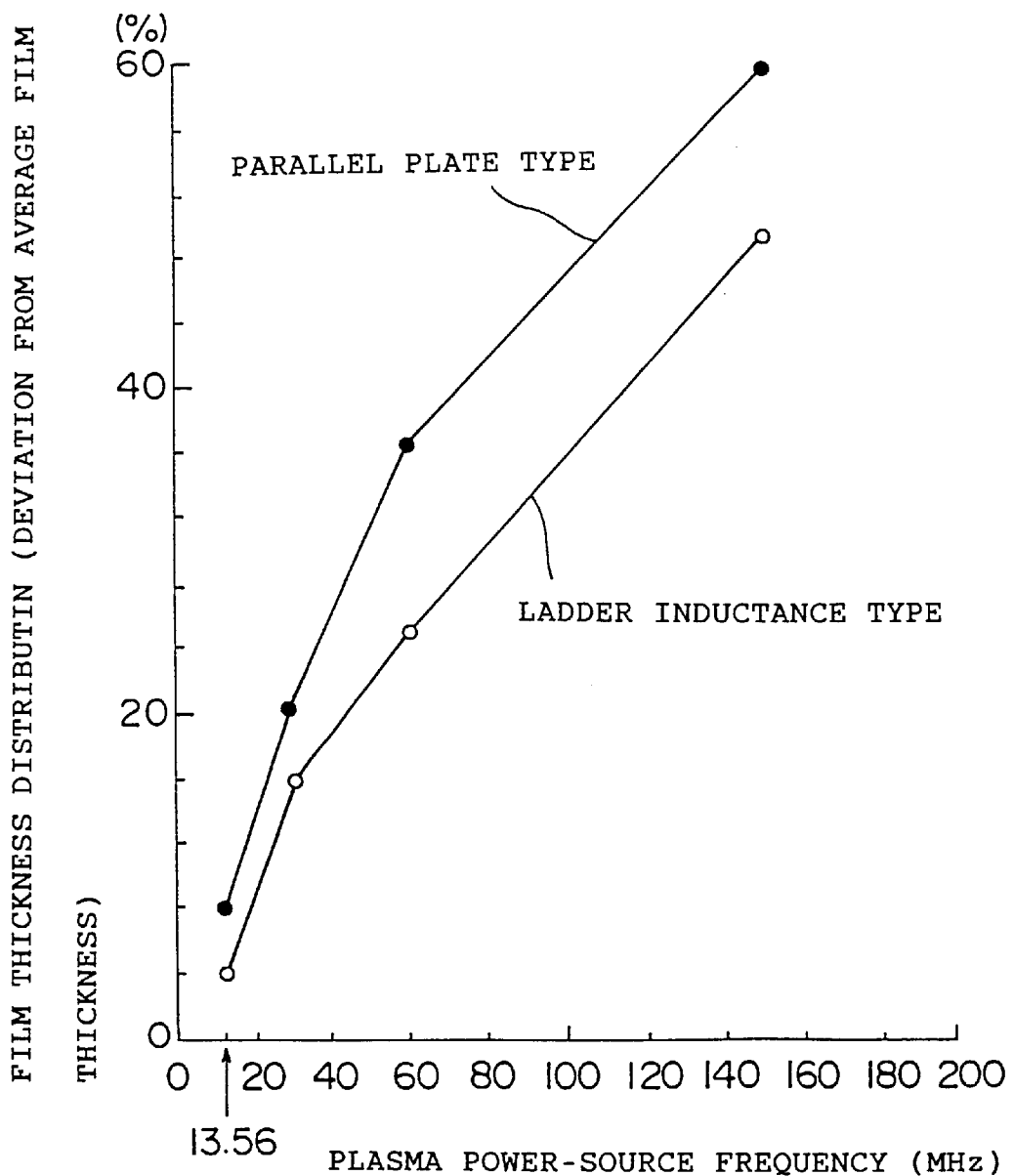
FIG. 24 is a characteristic graph showing the relationship between plasma power-source frequency and film-thickness distribution (deviation from an average film thickness) in the case of film deposition on a substrate having an area of 30 cm×30 cm effected by use of a ladder discharge electrode and a parallel-plate electrode.

FIG. 19 is a conceptual view showing a power-dividing method according to a fourth mode for carrying out the invention. FIG. 20 is a conceptual diagram showing the effect of the present mode.

As shown in FIG. 19, according to the present mode, power is supplied to the ladder electrode 11 from an RF power source 71 through a matching unit 72 and a coaxial cable 73. Since an output connector of the matching unit 72 is of N type, the output connector of the matching unit 72 is connected to the ladder electrode 11 through a coaxial cable 73, an N-type T adapter 74, a 10D-2V cable 75, an N-type T adapter 76, a 10D-2V cable 77, a flange 78 equipped with an N-type connector, and a coaxial cable 79 for vacuum use.

① In an RF plasma generation apparatus, in order to supply RF power to a plurality of points 13-1 to 13-4 on the ladder electrode 11, an output from the RF power source 71 is quartered in the following manner. An output from the RF power source 71 is transmitted through the coaxial cable 73. The coaxial cable 73 is branched into two coaxial cables 75, each having a length equal to one-fourth wavelength corresponding to radio frequency as measured in a cable and a characteristic impedance equal to that of the coaxial cable 73. Each of the coaxial cables 75 is branched into two coaxial cables 77, each having a characteristic impedance equal to that of the coaxial cable 75, whereby the output is quartered.

Thus, a portion of power supplied from the RF power source 71 which is lost in the course of transmission through the transmission line decreases, thereby increasing a portion of power to be used to generate plasma. Notably, even when the same power is supplied, film deposition rate is higher when the length of the coaxial cable 75 is 50 cm than when the length is 60 cm.

② In the structure as described above in ①, the same effects are obtained even when a "distributed constant line" is used in place of "coaxial cable."

An embodiment of the present mode will be described in detail in the section of ninth embodiment.

EMBODIMENTS

Preferred embodiments of the present invention will next be described. However, the present invention is not limited thereto.

[First Embodiment]

FIG. 1 is a conceptual diagram showing a first embodiment, which is a preferred embodiment of the first mode for carrying out the present invention.

As shown in FIG. 1, a ladder electrode 11 of a vapor deposition apparatus according to the present embodiment is configured such that a plurality of electrode bars 12a are arranged in parallel with each other and such that electrode bars 12b and 12c are connected to the corresponding opposite ends of the electrode bars 12a, thereby forming a ladder-like electrode. Power supply points 13 (13-1 to 13-4) are arranged axisymmetrically with respect to a reference line 14, which is a bisector which bisects one side of the RF discharge electrode 11, while being spaced a predetermined distance from the reference line 14. RF power is supplied to the power supply points 13-1 to 13-4 from an RF power source 16 through a matching unit 17 and a coaxial cable 15 serving as a transmission line.

The RF power source 16 generates a VHF band frequency of, for example, 60 MHz at 150 W. This RF power was supplied to the power supply points 13-1 to 13-4 on the ladder electrode 11 through the matching unit 17 and the coaxial cable 15. The present embodiment uses the coaxial cable 15 as a transmission line, but the present invention is not limited thereto. The coaxial cable 15 can transmit VHF band frequencies at low transmission loss and low cost in a simple manner and is thus preferred.

Two parallel metallic plates may be used as a transmission line, but involves some difficulty in routing within a reaction chamber. The present embodiment employed a coaxial cable for vacuum use as a coaxial cable installed within the reaction chamber. Generally, a coaxial cable is of 50 Ω or 75 Ω. The present embodiment employed one of 50 Ω. Since plasma impedance is not greater than 50 Ω use of a transmission line of lower impedance is preferred in order to reduce occurrence of reflected waves.

In the ladder electrode shown in FIG. 1, parallel connection was employed at a branch portion of the coaxial cable 15. In the present embodiment, division into four portions was made in two stages. However, division into four portions may be made at a time. Notably, lines extending from the matching unit 17 to the corresponding power supply points 13-1 to 13-4 had the same distance.

The ladder electrode 11 according to the present embodiment has a size of 42 cm×42 cm and is made of SUS. Each of the component electrode bars 12a has a diameter of 6 mm. The power supply points 13-1 to 13-4 were provided on the electrode bars 12b, which are connected to the corresponding ends of the electrode bars 12a to thereby constitute a peripheral portion of the ladder electrode 11. Two of the four power supply points 13-1 to 13-4 were positioned at opposite ends of one electrode bar 12a, whereas other two were positioned at opposite ends of another electrode bar 12a. The power supply points 13-1 and 13-4 were arranged axisymmetrically with respect to the centerline of the ladder electrode 11 serving as a reference line 14, while being spaced a predetermined distance ($d_1$) from the reference line 14.

Figure 2:
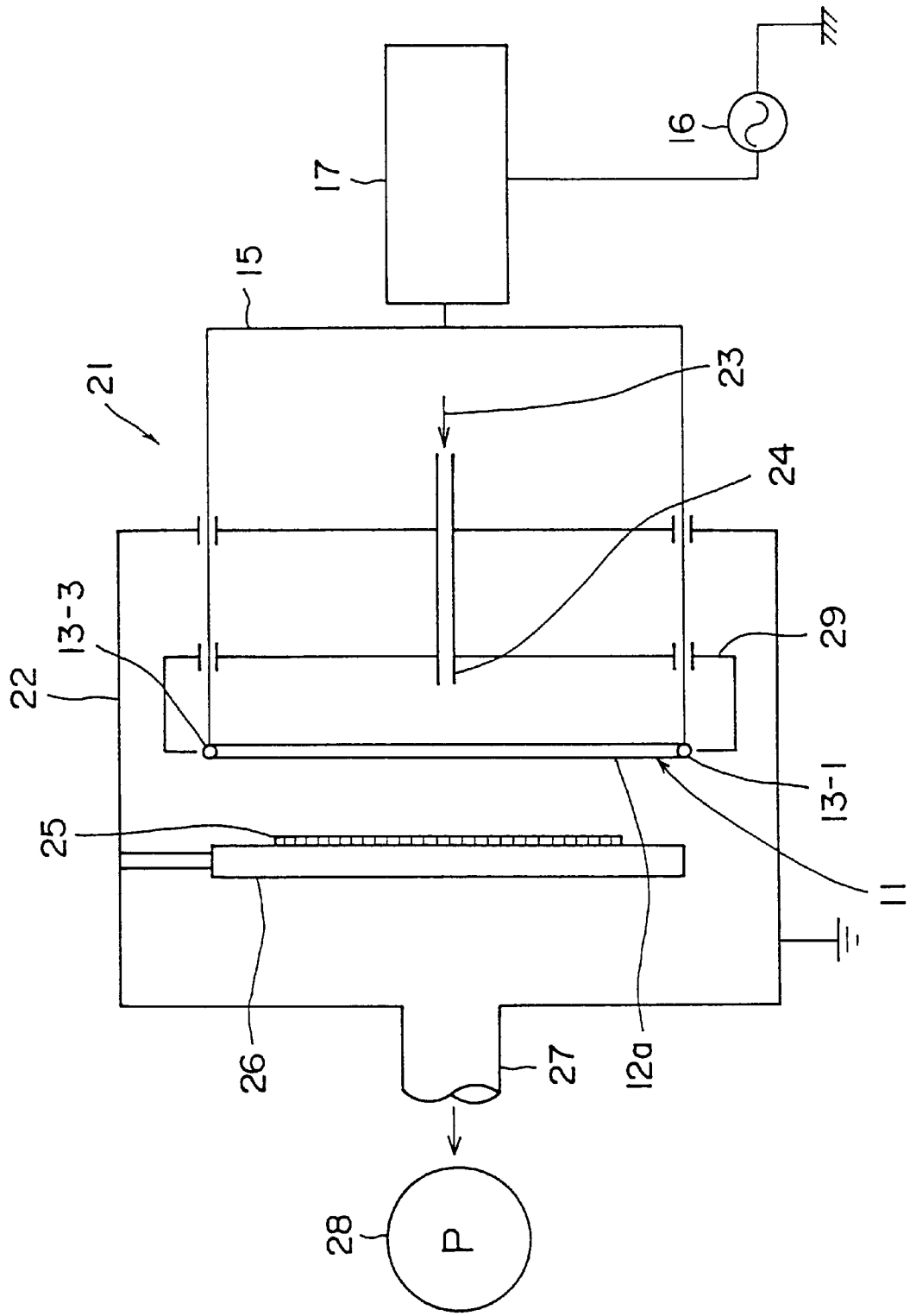
FIG. 2 is a schematic diagram of the plasma-enhanced vapor deposition apparatus according to the first embodiment.

FIG. 2 is configuration diagram of an RF plasma generation apparatus using the ladder electrode 11 shown in FIG. 1. As shown in FIG. 2, a PCVD 21 includes gas feed means having a gas feed pipe 24 for introducing a reaction gas 23 into a vacuum chamber 22; substrate heater-support means 26 for heating and supporting a substrate 25; and the ladder electrode 11 shown in FIG. 1 and disposed between the substrate heater-support means 26 and the material gas feed pipe 24. The gas is evacuated from the vacuum chamber 22 through an evacuation pipe 27 and by means of a vacuum pump 28.

A grounding shield 29 of the ladder electrode 11 prevents generation of plasma between the ladder electrode 11 and the vacuum chamber 22 and is adapted to pass through the ladder electrode 11 the reaction gas (monosilane) 23 supplied from the gas feed pipe 24 for generation of plasma and to lead the generated plasma toward the substrate 25. After being subjected to reaction, the reaction gas (monosilane) 23 is evacuated by means of the vacuum pump 28. The gas pressure is adjusted to 80 mTorr.

In the above-mentioned RF plasma generation apparatus, when the reaction gas 23 was supplied into the vacuum chamber 22, plasma of monosilane was generated around the ladder electrode 11 and in a space between the ladder electrode 11 and the substrate 25. The present embodiment used a large glass plate measuring 30 cm×30 cm serving as the substrate 25. An a-Si film was formed on the substrate 25.

Figure 4:
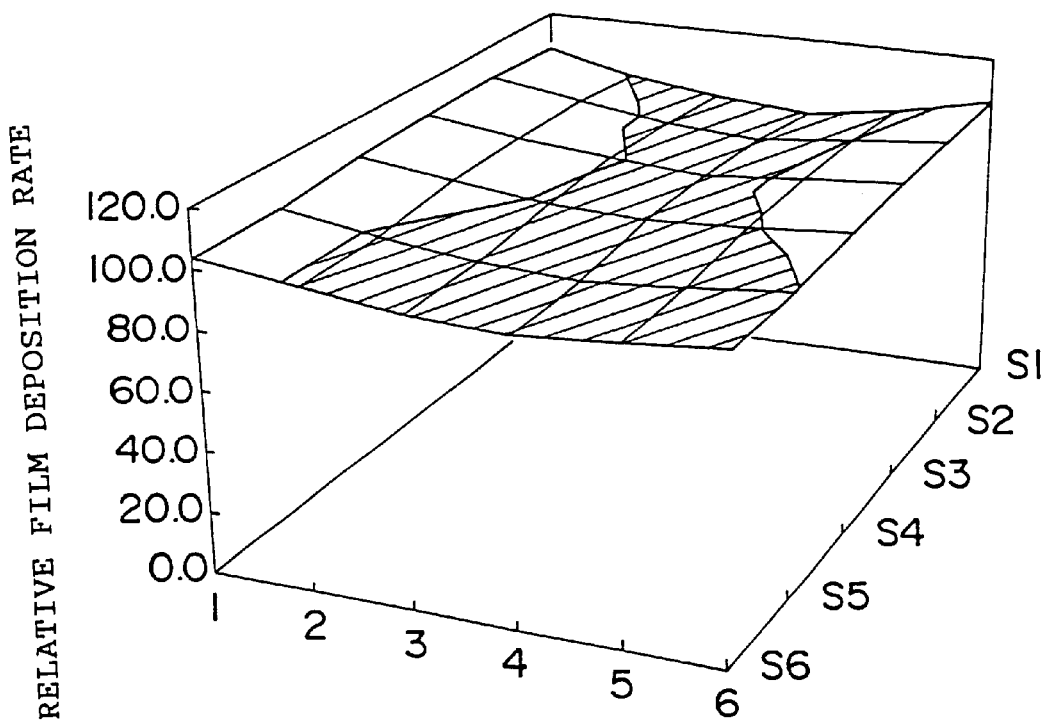
FIG. 4 is a diagram showing film deposition rate distribution associated with the first embodiment.

FIG. 4 shows film deposition rate distribution as observed in the present embodiment. As shown in FIG. 4, it was confirmed that the present embodiment provided uniform distribution having a uniformity of ±10%.

[Second Embodiment]

Figure 3:
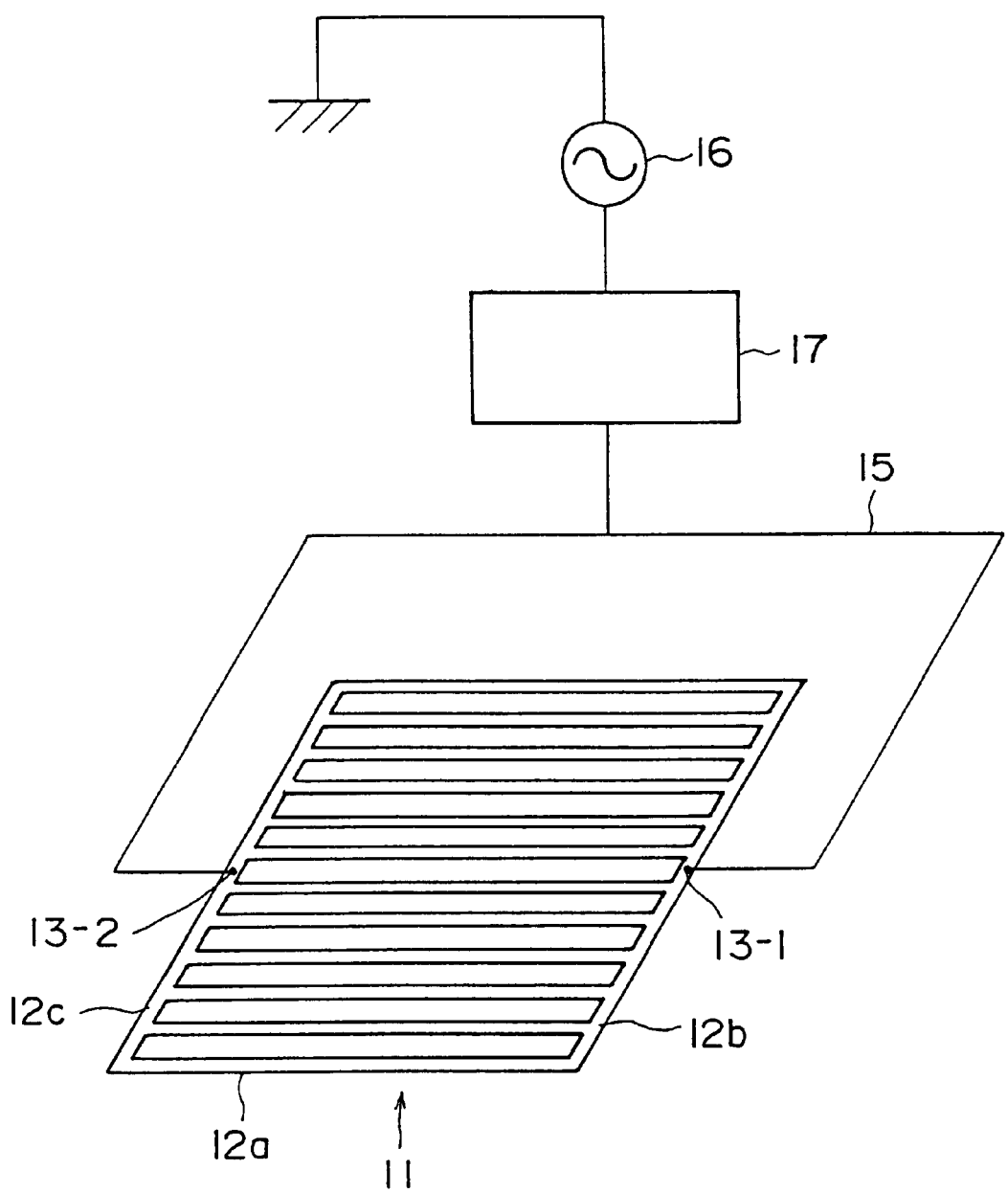
FIG. 3 is a perspective view of an RF discharge electrode of a plasma-enhanced vapor deposition apparatus according to a second embodiment of the present invention.
Figure 5:
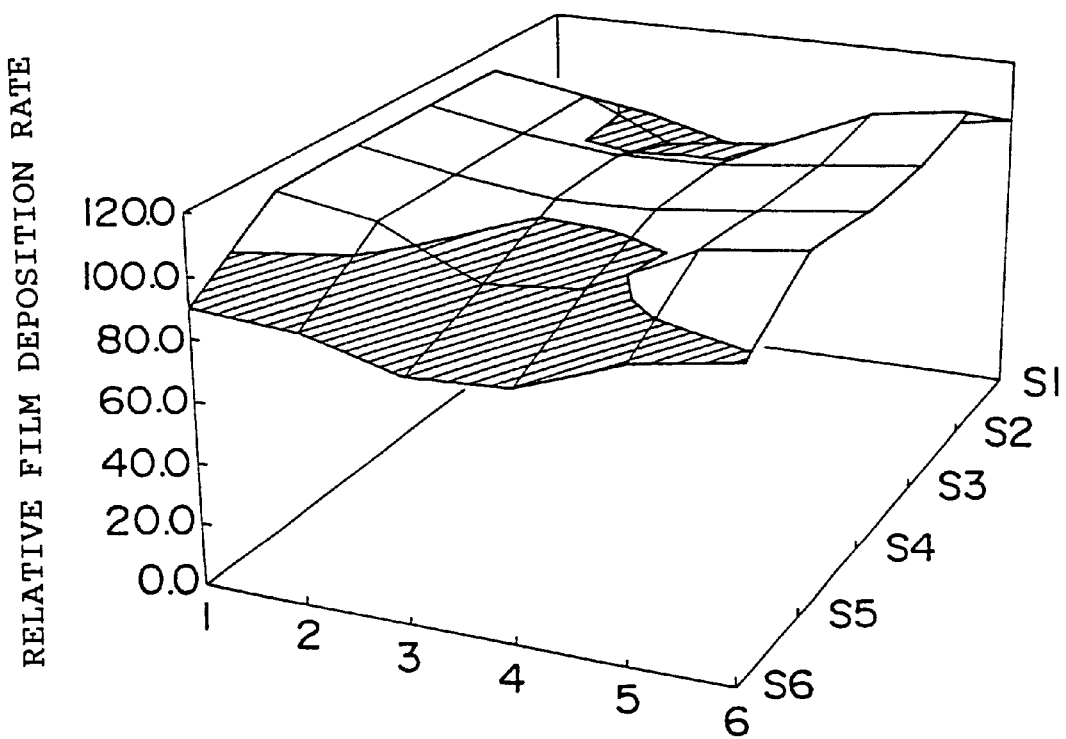
FIG. 5 is a diagram showing film deposition rate distribution associated with the second embodiment.

FIG. 3 shows a ladder electrode 11 according to a second embodiment, in which the ladder electrode shown in FIG. 1 is modified to a 2-point power supply apparatus. The second embodiment is a preferred embodiment of the first mode for carrying out the present invention. The ladder electrode 11 is similar to that of FIG. 1 except that a 2-point power supply apparatus is employed, and thus a description is omitted. FIG. 5 shows film deposition rate distribution as observed in depositing a film by use of the ladder electrode 11 of 2-point power supply shown in FIG. 3. As shown in FIG. 5, it was confirmed that a most portion of film deposition rate distribution on the substrate showed a uniformity of ±10%.

Although not illustrated, a larger electrode was tested while 8-point power supply was employed. In this case, even when the distance between a power supply point and a most distant point therefrom is ¼ to ⅛ wavelength, uniform distribution was obtained.

When the above-mentioned larger electrode was supplied with power at 4 points, the distance to a most distant point became ¼ wavelength or longer, and film deposition rate increased at positions distant from the power supply points, resulting in very nonuniform distribution of film deposition rates.

[Comparative Example]

Figure 6:
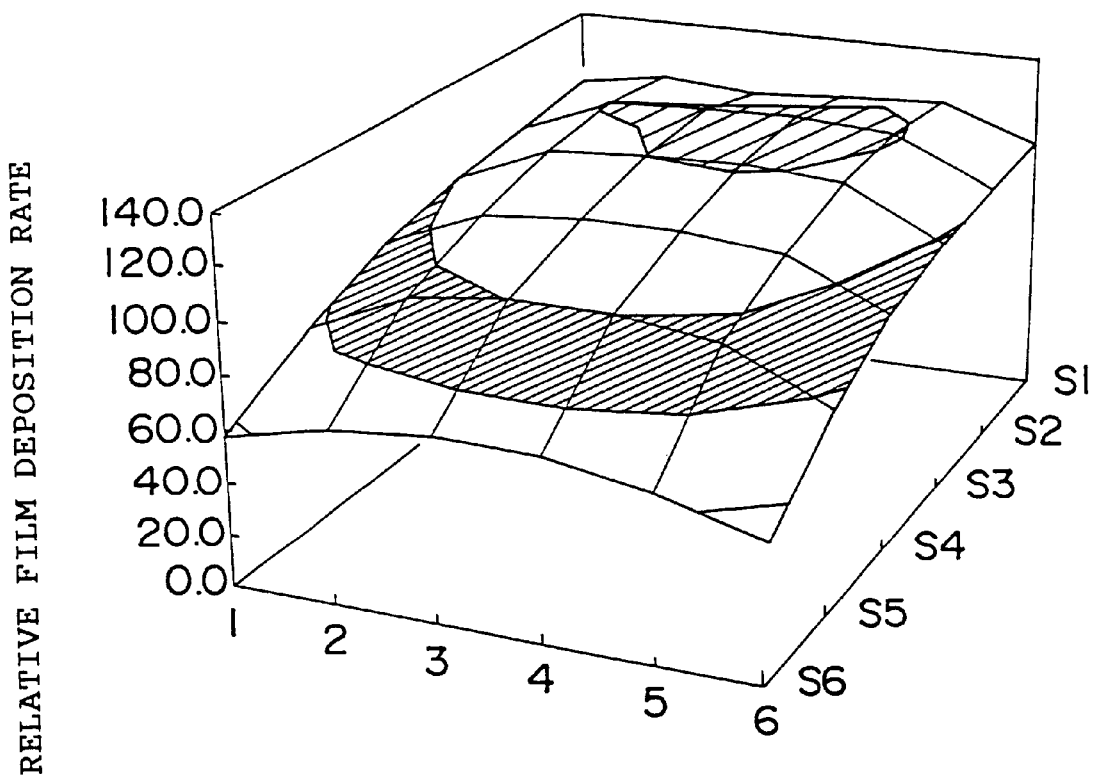
FIG. 6 is a diagram showing film deposition rate distribution associated with a comparative example.

FIG. 6 shows film deposition rate distribution as observed when a prior-art ladder electrode, which is supplied with power at a single center point, is used. As shown in FIG. 6, uniformity is ±40%, which is not acceptable in actual applications.

In the embodiments shown in FIGS. 1, 2, and 3, the power supply points are located at a peripheral portion of the ladder electrode, which portion does not face the substrate. Thus, uniformity of film deposition rate distribution is less susceptible to adverse effect of plasma generated around power lines.

Conceivably, the distribution of standing waves generated on the ladder electrode has the greatest effect on uniformity of film deposition rate distribution. As described in the first prior-art document (J. Appl. Phys. 54(8), 1983, 4367), in a one-dimensional electrode, voltage is the highest at a terminal end on the condition that the terminal end is open. Standing-wave distribution exhibits monotonic decrease up to λ/4 from the terminal end serving as the origin. As a result of expanded application of this principle to a ladder electrode, which is a two-dimensional electrode, for approximation, standing-wave distribution exhibits monotonic decrease up to λ/4 toward a power supply point on the ladder electrode while a most distant point from the power supply point serves as an open end. When multipoint power supply is employed, standing-wave distribution can be approximated as superposition of standing waves from the power supply points.

Accordingly, when the distance between a power supply point and a point on a ladder electrode which is most distant from the power supply point is not greater than λ/4, standing-wave distribution is not intensive. Particularly, when the distance is not greater than λ/8, standing-wave distribution almost vanishes. Thus, through combination of a ladder electrode and multipoint power supply, standing-wave distribution can be controlled so as to obtain uniform distribution of film deposition rates.

Through employment of four power supply points, standing-wave distribution on the ladder electrode of FIG. 1 became uniform, whereby plasma was generated uniformly, resulting in improved uniformity of film deposition rate distribution. In the present embodiment, the distance between the power supply point 13 and a most distant point on the ladder electrode 11 from the power supply point 13 is 58 cm, which is 1/14 wavelength. Thus, uniformity of discharge, which is affected by presence of standing waves, is improved, thereby contributing to uniform film deposition.

The ladder electrode is not grounded, thereby avoiding reduction in film deposition rate which would otherwise result from decrease in voltage at a grounded point.

In the case of FIG. 3, the distance to a most distant point is 42 cm, which is 1/12 wavelength. Thus, uniformity of standing-wave distribution was improved, thereby improving uniformity of film deposition rate distribution.

A larger electrode was also tested while 8-point power supply was employed. In this case, even when the distance to a most distant point from a power supply point was 1/4 to 1/8 wavelength, it was confirmed that uniform distribution was obtained as in the case of the distance being 1/8 wavelength or shorter.

As mentioned above, when the distance to a most distant point from a power supply point is 1/8 wavelength or shorter, uniform voltage distribution is obtained, thereby obtaining uniform film deposition rate distribution applicable to manufacture of thin-film-related products. Even when the distance is 1/8 to 1/4 wavelength, substantially satisfactory uniformity is obtained. However, when the distance is 1/4 wavelength or longer, presence of standing-wave distribution caused an increase in film deposition rate at positions distant from power supply points, resulting in nonuniform distribution.

In the case of power supply at a single center point, standing-wave distribution must be relatively uniform since the distance to a most distant point is 1/6 wavelength. However, since only a single power supply point is provided and the power supply point is located at the center of an electrode, plasma generated around a power line caused nonuniform distribution.

In the embodiments shown in FIGS. 1, 2, and 3, the power supply points are located at a peripheral portion of the ladder electrode, which does not face the substrate. Thus, conceivably, film deposition rate distribution is less susceptible to plasma generated around power lines. Plasma generated around a power line will be described in detail in the section of third embodiment.

In the embodiments of 4-point or 2-point power supply shown in FIGS. 1, 2, and 3, the power supply points on the ladder electrode are arranged axisymmetrically, thereby yielding symmetrical voltage distribution on the ladder electrode. In these embodiments, the positions of the power supply points were finely adjusted while film deposition rate distribution was being observed. The symmetrical voltage distribution facilitated this fine adjustment. By contrast, test results are not shown, but asymmetrical arrangement of power supply points involved complicated voltage distribution on the ladder electrode. As a result, the fine adjustment was confused.

Embodiments of a ladder electrode have been described. Next, an embodiment of a grid electrode will be described.

As in the case of the first and second embodiments of a ladder electrode, in which only horizontal electrode bars are employed, a grid type of ladder electrode using horizontal and vertical electrode bars is also expected to yield similar effects.

[Third Embodiment]

Figure 7:
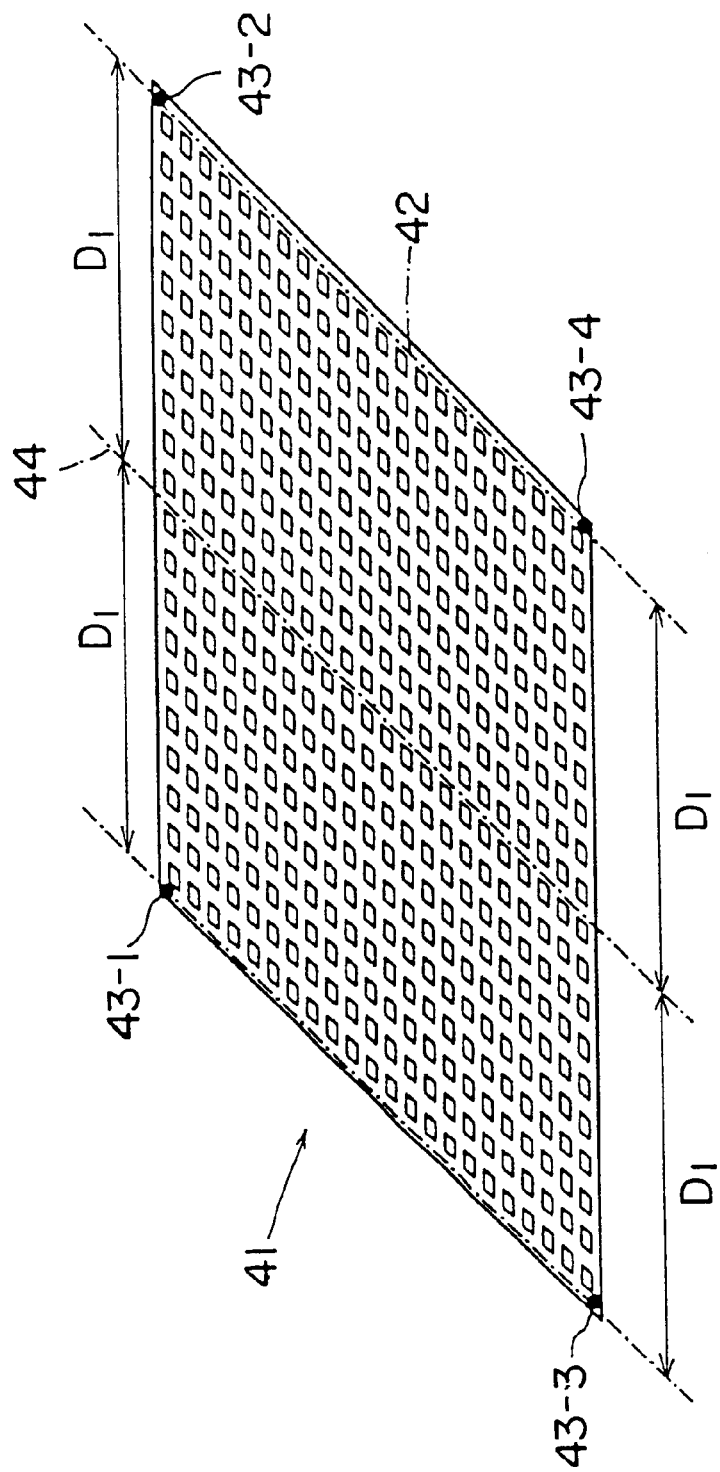
FIG. 7 is a perspective view of an RF discharge electrode of a plasma-enhanced vapor deposition apparatus according to a third embodiment of the present invention.
Figure 25:
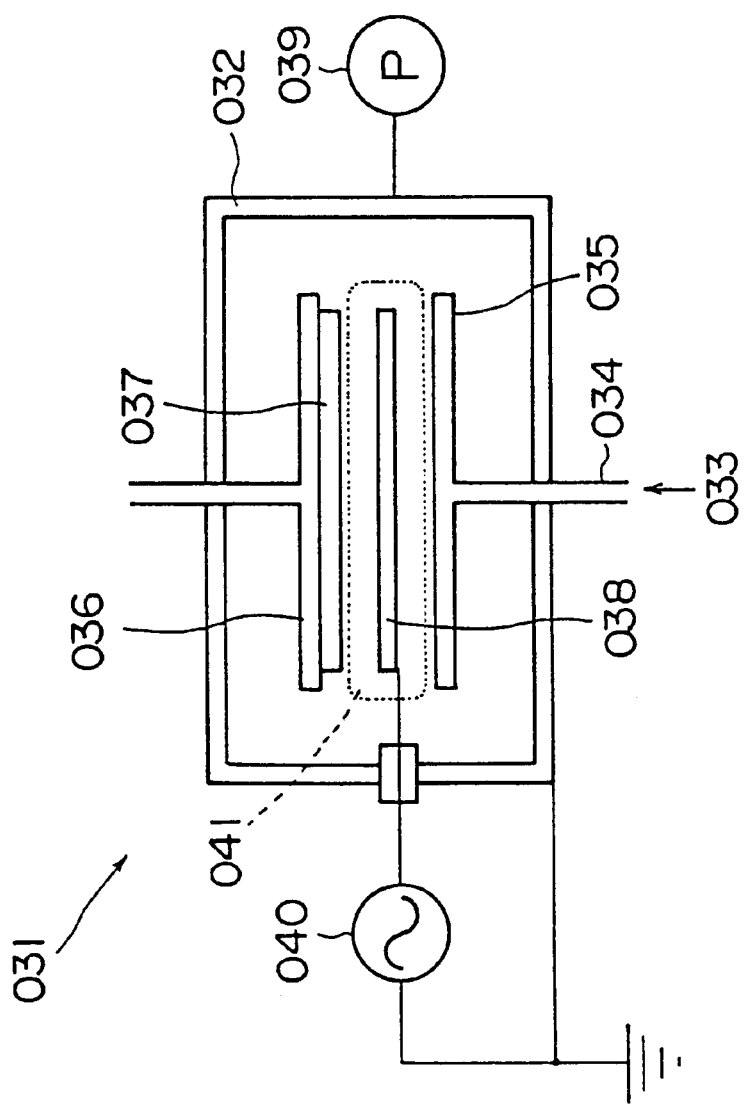
FIG. 25 is a schematic view of a plasma-enhanced vapor deposition apparatus.
Figure 26:
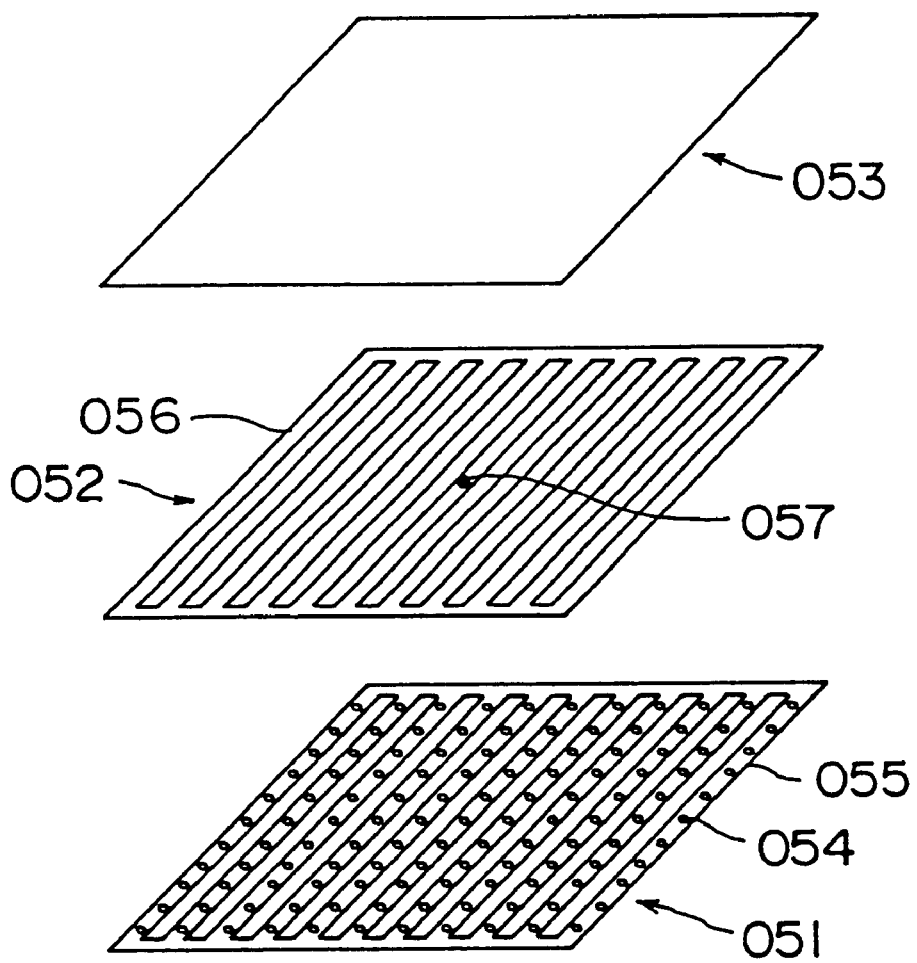
FIG. 26 is a view showing the forms and arrangement of a gas feed pipe, an RF discharge electrode, and a substrate employed in a conventional apparatus.
Figure 27:
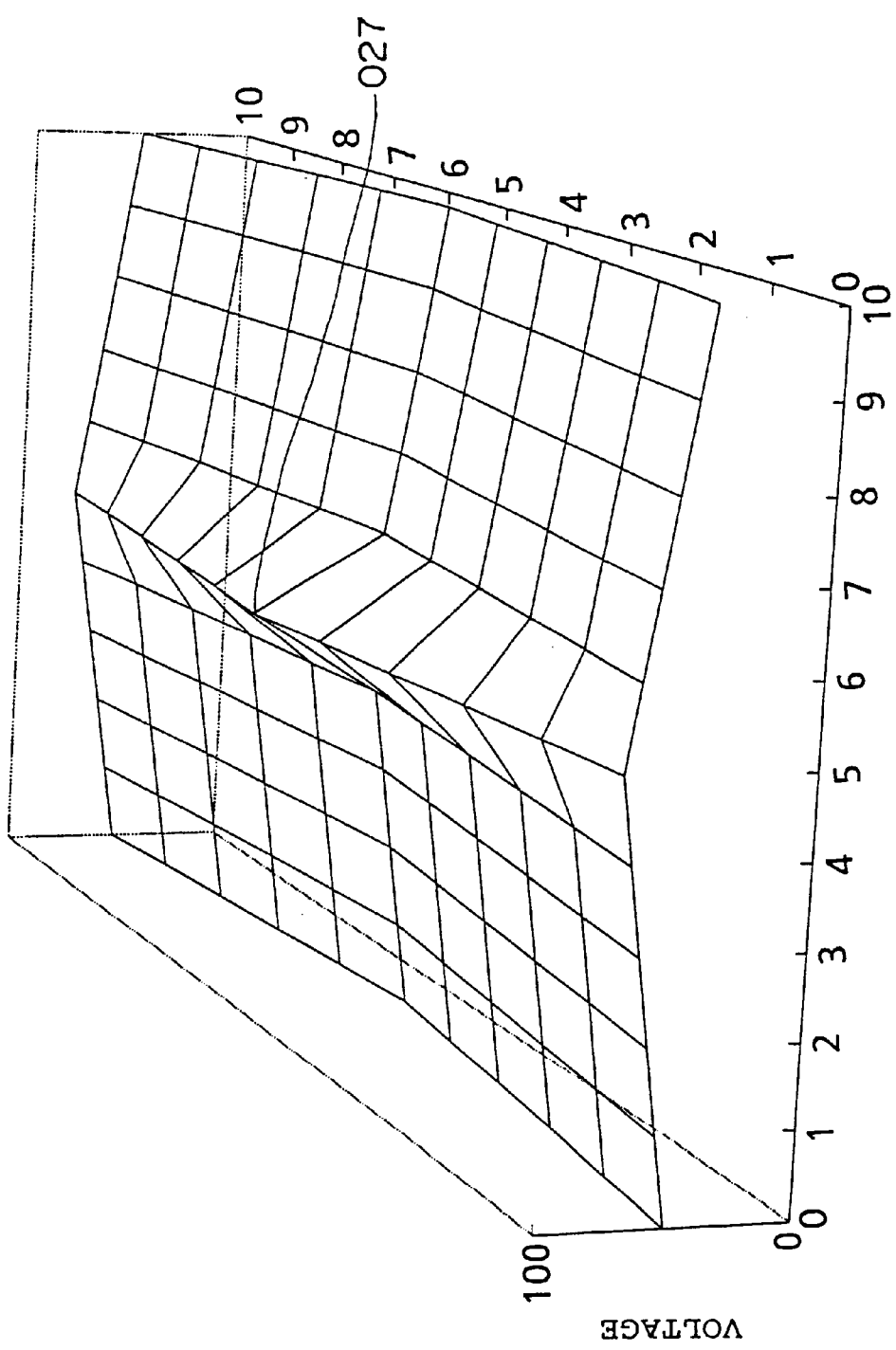
FIG. 27 is a diagram showing voltage distribution as observed when a conventional electrode is used.

FIG. 7 is a perspective view of an RF discharge electrode of a plasma-enhanced vapor deposition apparatus according to a third embodiment. The third embodiment is a preferred embodiment of the first mode for carrying out the present invention. As shown in FIG. 7, an RF discharge electrode 41 according to the third embodiment is configured such that two groups of electrode bars, each group comprising a plurality of parallel electrode bars 42, are arranged perpendicular to each other to thereby establish a grid form of electrode arrangement, and power supply points 43 (43-1 to 43-4) are arranged axisymmetrically with respect to a reference line 44, which is a bisector bisecting a side of the RF discharge electrode 41. The grid form is not particularly limited. The RF discharge electrode 41 according to the present embodiment replaces the RF discharge electrode 038 of the vapor deposition apparatus 031 shown in FIG. 25.

Figure 8:
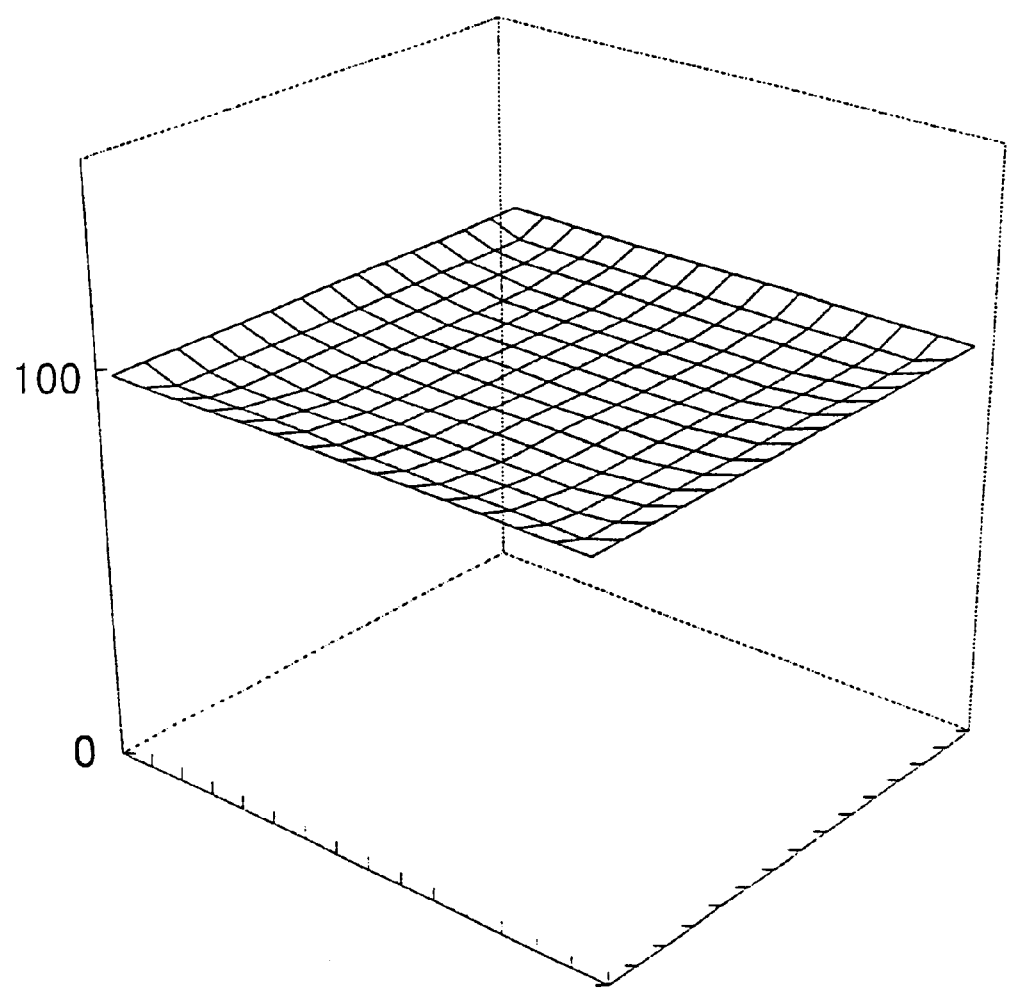
FIG. 8 is a diagram showing voltage distribution as observed when the electrode according to the third embodiment is used.

In the present embodiment, the four power supply points 43-1 to 43-4 are arranged in such a manner as to be spaced predetermined distance $D_1$ from the reference line 44; as a result, the four power supply points are disposed at the corresponding four corners of the RF discharge electrode 41. The power supply points 43-1 and 43-2 are arranged in such a manner as to be spaced predetermined distance $D_1$ from the bisector 44, and the power supply points 43-3 and 43-4 are also arranged similarly. Thus, as shown in FIG. 8, voltage distribution becomes substantially uniform, thereby enabling deposition of a thin film having sufficient uniformity (within ±10%).

[Fourth Embodiment]

Figure 9:
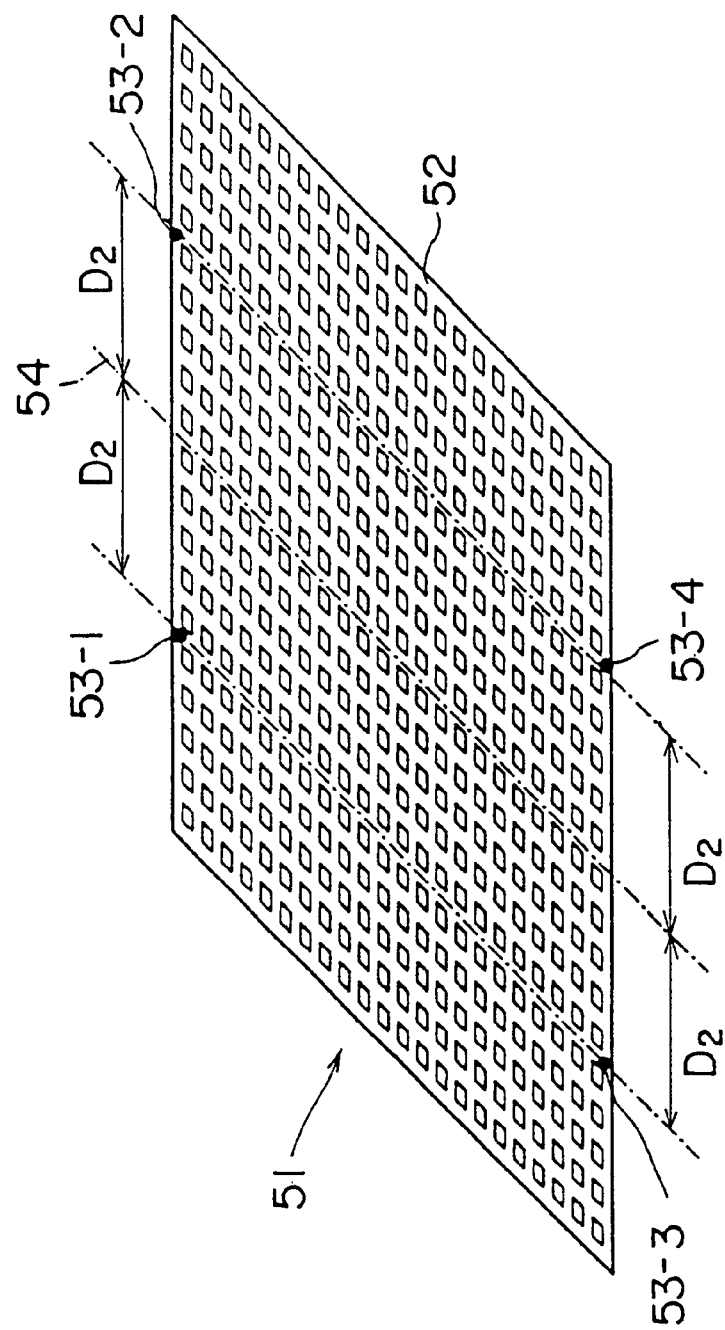
FIG. 9 is a perspective view of an RF discharge electrode of a plasma-enhanced vapor deposition apparatus according to a fourth embodiment of the present invention.

FIG. 9 is a perspective view of an RF discharge electrode of a plasma-enhanced vapor deposition apparatus according to a fourth embodiment. The fourth embodiment is a preferred embodiment of the first mode for carrying out the present invention. As shown in FIG. 9, an RF discharge electrode 51 according to the present embodiment is configured such that parallel electrode bars 52 are arranged in the form of grid to thereby establish a grid form of electrode arrangement, and power supply points 53 (53-1 to 53-4) are arranged axisymmetrically with respect to a reference line 54, which is a bisector bisecting a side of the RF discharge electrode 51.

Figure 10:
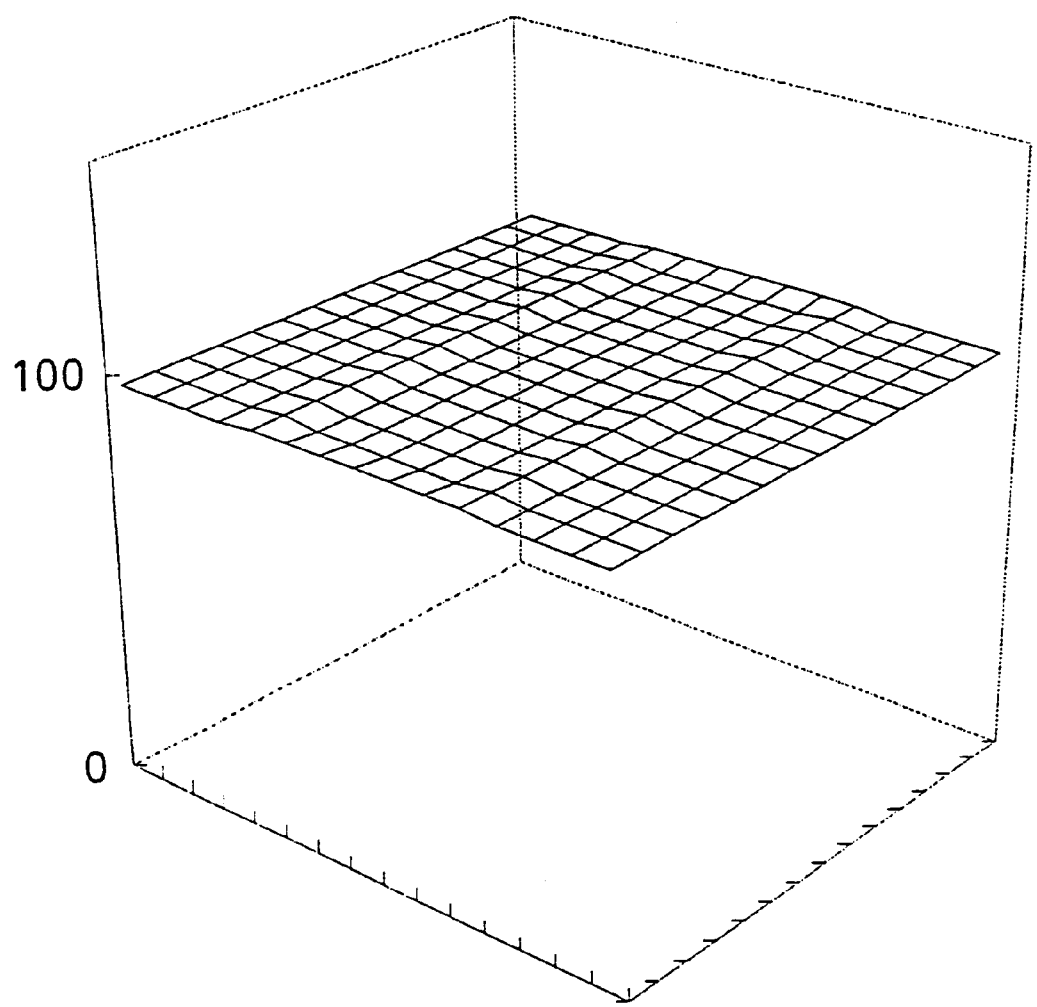
FIG. 10 is a diagram showing voltage distribution as observed when the electrode according to the fourth embodiment is used.

In the present embodiment, the four power supply points 53-1 to 53-4 are located somewhat to a centerline as compared with the case of the first embodiment, while being spaced predetermined distance $D_2$ from the reference line 54. The power supply points 53-1 and 53-2 are arranged in such a manner as to be spaced predetermined distance $D_2$ from the bisector 54, and the power supply points 53-3 and 53-4 are also arranged similarly. Thus, as shown in FIG. 10, the present embodiment provides voltage distribution of higher uniformity than does the third embodiment, thereby enabling deposition of a thin film having sufficient uniformity (within ±10%).

[Fifth Embodiment]

Figure 11:
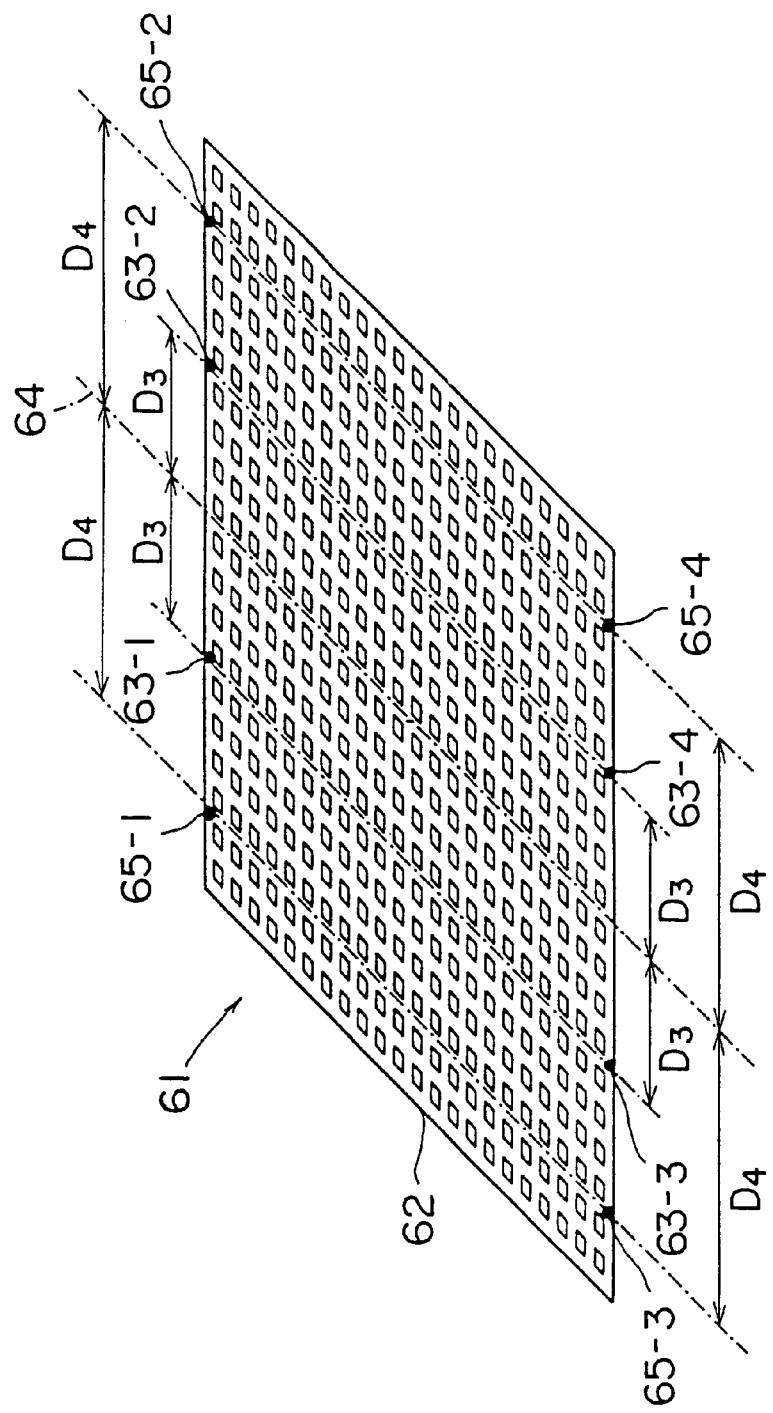
FIG. 11 is a perspective view of an RF discharge electrode of a plasma-enhanced vapor deposition apparatus according to a fifth embodiment of the present invention.
Figure 1:
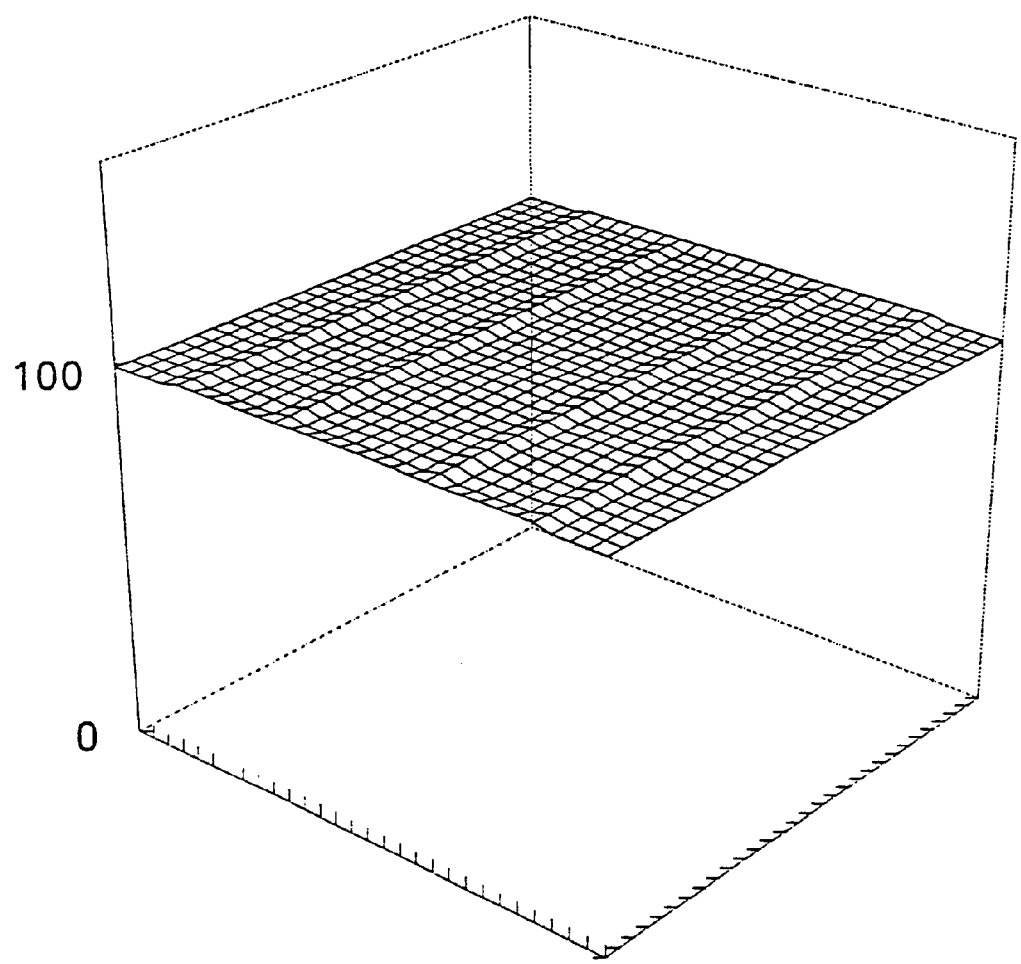

FIG. 11 is a perspective view of an RF discharge electrode of a plasma-enhanced vapor deposition apparatus according to a fifth embodiment. The fifth embodiment is a preferred embodiment of the first mode for carrying out the present invention. The fifth embodiment implements film deposition over a relatively large area as compared with the previously described third and fourth embodiments. As shown in FIG. 11, a large RF discharge electrode 61 according to the present embodiment is configured such that parallel electrode bars 62 are arranged in the form of grid to thereby establish a grid form of electrode arrangement, and a plurality of power supply points 63 (63-1 to 63-4) are arranged axisymmetrically with respect to a reference line 64, which is a bisector bisecting a side of the RF discharge electrode 61.

In the present embodiment, eight power supply points are arranged on the electrode, while being spaced first predetermined distance $D_3$ and second predetermined distance $D_4$ from the reference line 64. A plurality of power supply points are arranged, while being spaced predetermined distances; specifically, the power supply points 63-1 and 63-2 are arranged in such a manner as to be spaced first predetermined distance $D_3$ from the reference line 64; the power supply points 63-3 and 63-4 are arranged in such a manner as to be spaced first predetermined distance $D_3$ from the reference line 64; the power supply points 65-1 and 65-2 are arranged in such a manner as to be spaced second predetermined distance $D_4$ from the reference line 64; and the power supply points 65-3 and 65-4 are arranged in such a manner as to be spaced second predetermined distance $D_4$ from the reference line 64. Thus, as shown in FIG. 12, voltage distribution becomes substantially uniform, thereby enabling deposition of a thin film having sufficient uniformity (within ±10%) over a larger area than in the case of the first embodiment.

[Sixth Embodiment]

Figure 13:
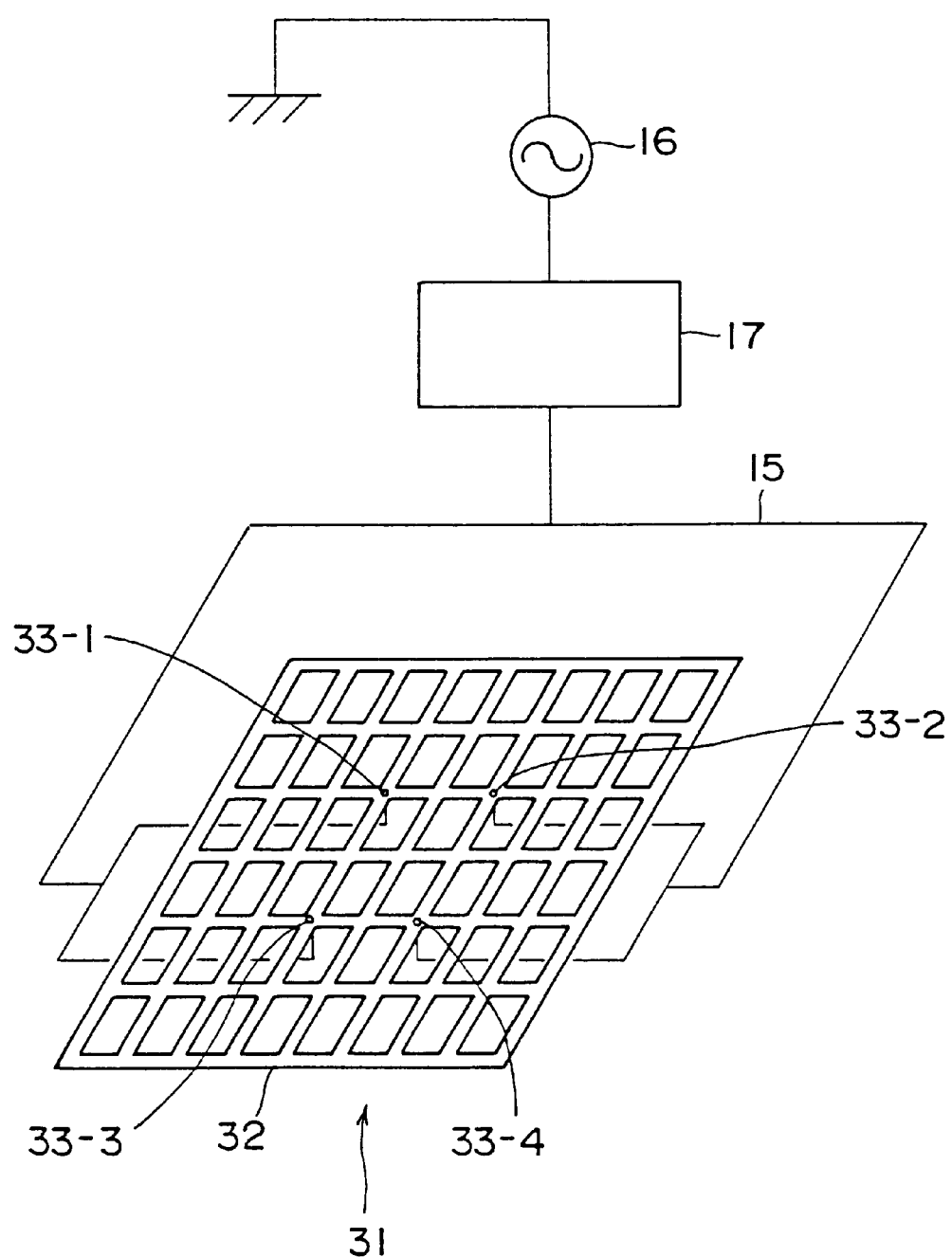
FIG. 13 is a perspective view of an RF discharge electrode of a plasma-enhanced vapor deposition apparatus according to a sixth embodiment of the present invention.
Figure 14:
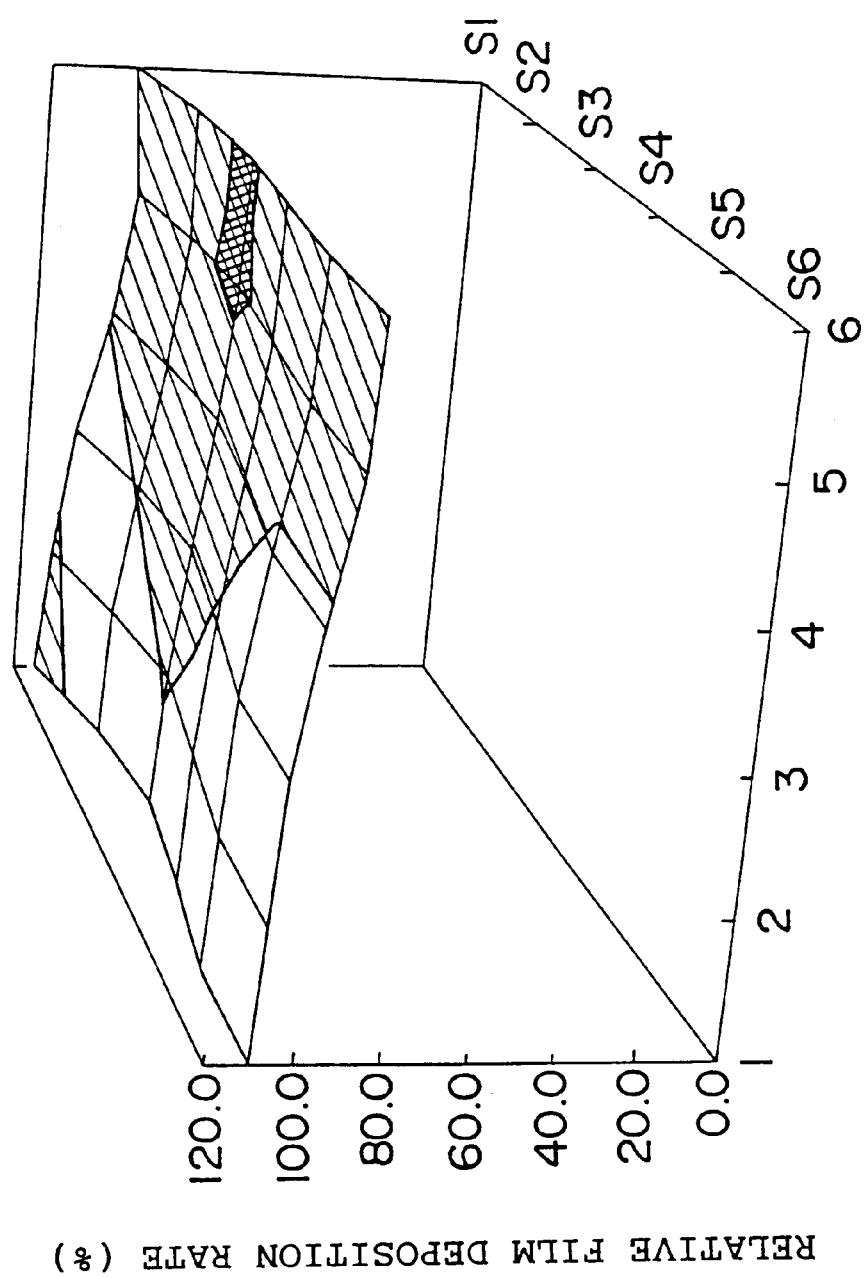
FIG. 14 is a diagram showing voltage distribution as observed when the electrode according to the sixth embodiment is used.

FIG. 13 is a perspective view of an RF discharge electrode of a plasma-enhanced vapor deposition apparatus according to a sixth embodiment. The sixth embodiment is a preferred embodiment of the first mode for carrying out the present invention. FIG. 14 shows film deposition rate distribution exhibited by the present embodiment.

As shown in FIG. 13, RF power is supplied to a grid-type ladder electrode 31 from an RF power source 16 through a matching unit 17 and a coaxial cable 15. The grid-type ladder electrode 31 is composed of electrode bars 32. Four power supply points 33 (33-1 to 33-4) are located at the corresponding four corners of central four blocks of the grid composed of the electrode bars 32. According to the present embodiment, the power supply points 33 (33-1 to 33-4) are located at a central portion of the grid-type ladder electrode 31, not at a peripheral portion of the electrode 31. The coaxial cables 15 are connected to the corresponding power supply points 33 from behind the grid-type ladder electrode 31 and are adapted to apply thereto a VHF-band frequency of 60 MHz at 150 W.

In a manner similar to that of the first embodiment, monosilane was supplied to a discharge portion, and plasma was generated to deposit a film. As shown in FIG. 14, uniformity of film deposition rate distribution fell within ±20%, which is marginal uniformity for practical application. However, intensity of plasma generated in the vicinity of the power supply points showed a tendency to increase with VHF-band frequency input, showing a potential impairment in uniformity of film deposition rate distribution at an input of 150 W or higher.

The test conducted by use of the ladder electrode according to the present embodiment showed that a grid-type ladder electrode was able to provide uniformity of film deposition rate distribution similar to that provided by a horizontal-bar-type ladder electrode. Even when the power supply points were located at a central portion of the electrode, film deposition rate distribution assumed uniformity substantially equal to that observed in the case of the first embodiment, in which the power supply points are located at a peripheral portion of the electrode. However, this is limited to relatively low VHF-band frequency input up to about 150 W.

[Seventh Embodiment]

FIG. 15 is a detailed view of an embodiment of a power supply portion of a ladder electrode through which power is supplied to the ladder electrode, showing a preferred embodiment of the second mode for carrying out the invention. FIG. 16 is a side view showing a main portion of the power supply portion. In the first embodiment, a core conductor of the coaxial cable was merely screwed on the ladder electrode at the corresponding power supply point. At an input of about 150 W at 60 MHz, generation of unnecessary plasma around the coaxial cable in the vicinity of the power supply point was not markedly observed, and a film having favorable uniformity was formed.

Employing the same configuration as does the first embodiment, the present embodiment was tested while being supplied with an RF power of 200 W at 100 MHz. At this time, employment of a power supply structure similar to that of the first embodiment involved generation of intense discharge resembling corona discharge around the core conductor and around a shield, indicating potential impairment in film deposition rate distribution. Also, generation of powder was observed.

To cope with this problem, a metallic connector 101 having a diameter of 10 mm was attached through caulking to the core conductor (invisible in FIGS. 15 and 16). One end of the metallic connector 101 was fixedly attached to an electrode bar 12b of a ladder electrode 11 at a power supply point 13 by means of a screw 102. The electrode bar 12b, on which the power supply point 13 is located, and an adjacent electrode bar 12a have a diameter of 6 mm. The metallic connector 101 had a length of 2.5 cm. An uninsulated bare portion of the metallic connector 101 had a length of 2 cm. An annular insulator 103 was attached to a 5 mm portion of the metallic connector 101 adjacent to a terminal metal 104 of the coaxial cable 15. The distance (a) between the terminal metal 104 of a grounding shield 15a of the coaxial cable 15 and the power supply point 13 on the ladder electrode 11 was rendered 2.5 cm.

The metallic connector 101 and the coaxial cable 15 were perpendicularly attached to the ladder electrode 11 from opposite a substrate 25 (attached to the back side of the ladder electrode 11).

In the present embodiment, the shortest distance (b) from a grounding shield 29 to the metallic connector 101 was rendered 3 cm.

When a film is to be formed at VHF-band frequency by use of a ladder electrode, plasma generated in the vicinity of a power supply point on the ladder electrode impairs uniformity of the film. Plasma generated in the vicinity of the power supply point is divided into the following three types: ① plasma generated around a metallic connector connected to a power supply point; ② plasma generated around a terminal metal of a grounding shield of a coaxial cable; and ③ plasma generated around the grounding shield of the coaxial cable.

Since the diameter of the metallic connector adapted to connect the power supply point 13 and the core conductor of the coaxial cable 15 was rendered greater than the diameter of the ladder electrode bar as measured in the vicinity of the power supply portion, concentrated electric field around the metallic connector became weaker than concentrated electric field around the ladder electrode bar. Thus, plasma generated around the metallic connector became weaker than plasma generated around the ladder electrode bar and thus less affected film deposition rate. When the core conductor was directly connected to the power supply point 13, electric field was concentrated on the core conductor, since the core conductor is fine. As a result, intense plasma was generated around the core conductor, resulting in generation of powder.

Through employment of a distance (a) of at least 1 cm, preferably 2 cm or more, between the power supply point 13 and the terminal metal 104 of the grounding shield 15a of the coaxial cable 15, plasma generated around the terminal metal 104 of the grounding shield was weakened. Conceivably, this is because the distance between the ladder electrode 11 having high potential and the grounding shield having ground potential was increased; thus, electric field generated therebetween was weakened. Notably, when the distance (a) is less than 1 cm, plasma is generated around the terminal metal 104 of the grounding shield, unfavorably resulting in generation of powder.

Since the coaxial cable 15 and the metallic connector 101 were perpendicularly attached to the ladder electrode 11 from behind (from opposite the substrate 25), electric field around the metallic connector 101 and around the shield of the coaxial cable 15 was weakened. Thus, the intensity of plasma generated around the shield of the coaxial cable 15 was weakened. Also, this plasma became relatively distant from the substrate, thus less affecting film deposition rate distribution. Notably, when the coaxial cable 15 is attached to the ladder electrode 11 at an angle of 45° or less with respect to the ladder electrode 11, plasma generated around the shield of the coaxial cable 15 is unfavorably intensified.

Through employment of a distance (b) of at least 1 cm, preferably 2 cm or more, between the grounding shield 29 and the metallic connector 101, plasma generated between the metallic connector 101 and the grounding shield 29 was able to be suppressed, whereby the adverse effect of the plasma on film deposition rate distribution was able to be lessened. Notably, when the distance (b) is less than 1 cm, the plasma is intensified, unfavorably resulting in generation of powder.

[Eighth Embodiment]

FIG. 17 is a sectional view of an embodiment of a power supply portion of a ladder electrode through which power is supplied to the ladder electrode, showing a preferred embodiment of the third mode for carrying out the invention. FIG. 18 is an enlarged view of portion A of the embodiment.

In the present embodiment, the ladder electrode 11, the substrate 25, the substrate heater 26, and the grounding shield 29 were arranged in a manner similar to that of the first embodiment. A metallic connector 201 was fixedly attached to the power supply point 13 of the ladder electrode 11 by use of a screw 200. The metallic connector 201 is made of a SUS304 bar having a diameter of 6 mm, which is equal to the diameter of a component bar 12a of the ladder electrode 11. The metallic connector 201 may be made of a metal having conductivity higher than that of stainless steel, such as copper or aluminum. However, the present embodiment selected SUS304 in order to suppress generation of impurities.

The previously described embodiments employed a round-head screw for connecting the metallic connector to the ladder electrode. However, since concentration of discharge on the round-head screw were observed at a frequency of 120 MHz, the present embodiment employed a countersunk-head screw serving as the screw 200 so as to avoid this problem through avoidance of projection of a screw head.

In the present embodiment, the metallic connector 201 was covered with an insulator 202. The inside diameter of the insulator 202 was 1 mm greater than the outside diameter of the metallic connector 201; the gap (s) was 0.5 mm; and the outside diameter of the insulator 202 was 20 mm. It was confirmed that, when the gap (s) between the inner surface of the insulator 202 and the peripheral surface of the metallic connector 201 is 3 mm or greater, discharge occurs in the gap at an input of 200 W or greater and 60 MHz. However, at a gap (s) of 0.5 mm employed in the present embodiment, no discharge occurred even at an input of 200 W and 120 MHz. When the outside diameter of the insulator 202 was 10 mm or less, plasma was generated locally around the insulator 202 at an input of 200 W or greater and 60 MHz. However, at an outside diameter of 20 mm of the insulator 202, no discharge occurred even at an input of 200 W and 120 MHz.

As shown in FIG. 17, in the present embodiment, the metallic connector 201 and the insulator 202 were inserted into a receptacle 203 provided on the grounding shield 29. A connector 204 located at an end of the coaxial cable 15 was connected to the receptacle 203.

A jack connector 206 was fixedly attached through caulking to a core conductor 205 of the coaxial cable 15 and was fitted to the metallic connector 201. The grounding shield 15a of the coaxial cable 15 was welded to an end ring 207 and was connected to the receptacle 203 of the grounding shield 29 by means of a spring 208 and a box nut 209 of the connector 204.

The outside diameter of the jack connector 206 was rendered equal to that of the metallic connector 201 so as to establish a gap (s) of 0.5 mm between the peripheral surface of the jack connector 206 and the inner surface of the insulator 202. The insulator 202 was inserted into a welded portion composed of the receptacle 203 and the connector 204 so that every wall-to-wall gap assumed 0.5 mm. At a gap (s) of 3 mm or greater, discharge occurred at an input of 200 W or greater and 60 MHz. At a gap (s) of 0.5 mm, no discharge occurred even at an input of 200 W and 120 MHz.

The seventh embodiment provided uniform film deposition rate distribution even when high RF power (for example, 100 MHz and 200 W) was supplied. This is because unnecessary plasma was weakened, thereby lessening the adverse effect of unnecessary plasma on film deposition. Also, in the seventh embodiment, the power supply portion is located at a peripheral portion of the electrode which does not face the substrate, thereby lessening the adverse effect of unnecessary plasma on film deposition.

The arrangement of the sixth embodiment, in which the power supply portion is located at a central portion of the electrode facing the substrate, and the power supply method of the seventh embodiment involved impairment in uniformity of film deposition rate distribution when high RF power was supplied. When the frequency and power of input were increased further (to, for example, 120 MHz and 200 W), even the arrangement of the first embodiment involved impairment in film deposition rate distribution and generation of powder.

According to the present embodiment, the insulator 202 was disposed around the metallic connector of the power supply portion to thereby completely eliminate plasma from around the metallic connector 201, thereby preventing impairment in uniformity of film deposition rate distribution.

If a wide gap is present between the core conductor and the external shield within the interior of the connection of the connector 201 and the receptacle 203, plasma will be generated within the gap. Thus, the insulator 202 was disposed so as to narrow the gap, thereby preventing generation of plasma within the gap.

In the present embodiment, the presence of the insulator 202 prevents occurrence of discharge around the metallic connector 201 and within the interior of the connection of the connector 201 and the receptacle 203, for the following reason. In a DC electric field, since current is less likely to flow through an insulator, discharge current is suppressed, thereby retarding occurrence of discharge. However, in an RF electric field, displacement current flows through an insulator. Thus, the discharge suppression effect observed in the DC electric field does not work. Here, the effect of the insulator is to eliminate a space filled with monosilane gas in which discharge occurs, thereby eliminating discharge volume. This effect differs from the discharge current prevention effect as observed in the DC electric field. Therefore, a thin insulator is not effective.

According to the present embodiment, the insulator 202 disposed around the metallic connector 201 assumes the form of cylinder. However, the present invention is not limited thereto. For example, the insulator 202 may assume the form of rectangle or bottleneck as observed with porcelain insulators.

Ideally, the gap (s) between the peripheral surface of the metallic connector 201 and the inner surface of the insulator 202 must be zero. However, in actuality, in consideration of thermal expansion and manufacturing accuracy, a slight gap must be formed therebetween. In RF discharge, no dielectric breakdown occurs at a certain range of sufficiently narrow gap not greater than the thickness of sheath. Therefore, such a range is employed in the present embodiment. A range shown in the embodiment is considered as such a range.

In order to decrease space which permits occurrence of discharge, the outside diameter of the insulator 202 is preferably increased. However, when the outside diameter is too large, main discharge of the ladder electrode is affected; as a result, uniformity of film deposition rate distribution is affected. Conceivably, the outside-diameter range shown in the embodiment is effective in preventing generation of unnecessary plasma around the connector while having no adverse effect on main discharge.

The insulator is inserted into the interior of the connector-receptacle connection such that gaps formed inside and outside the insulator are sufficiently narrow to suppress occurrence of discharge therein. When discharge occurred due to a wide gap, powder was generated, and the insulation resistance between the core conductor and the ground was impaired with resultant occurrence of short circuit.

Since the connector-receptacle connection is employed for connection of the transmission line to the ladder electrode, the grounding shield of the ladder electrode and the grounding shield of the transmission line (in the present embodiment, coaxial cable) are short-circuited, so that there is no potential difference therebetween, thereby suppressing occurrence of unnecessary plasma around the grounding shield of the transmission line. Also, the connector-receptacle connection facilitates attachment/detachment of the transmission line for maintenance.

[Ninth Embodiment]

FIG. 19 is a conceptual view showing a power-dividing method of a ninth embodiment, which is a preferred embodiment of the fourth mode for carrying out the invention. FIG. 20 is a conceptual diagram showing the effect of the present embodiment.

As shown in FIG. 19, according to the present embodiment, power is supplied to the ladder electrode 11 from an RF power source 71 through a matching unit 72 and a coaxial cable 73. An output connector of the matching unit 72 is of N type. The coaxial cable 73 is connected to the output connector. The coaxial cable 73 employed was a 10D-2V cable having a characteristic impedance of 50 Ω and a length of 1 m. The opposite ends of the coaxial cable 73 assumed the form of an N-type connector. The downstream end of the coaxial cable was connected to an N-type T adapter 74 to thereby be divided into two portions. Two 10D-2V cables 75, each having a characteristic impedance of 50 Ω, were connected to the corresponding opposite ends of the N-type T adapter 74. The opposite ends of each of the cables 75 assumed the form of an N-type connector. The downstream ends of the cables 75 were connected to the corresponding two N-type T adapters 76 to thereby be divided into a total of four portions. Four 10D-2V cables 77, each having a characteristic impedance of 50 Ω, were connected to the corresponding ends of the T adapters 76. Each of the cables 77 had a length of 20 cm. The opposite ends of each of the cables 77 assumed the form of an N-type connector. The downstream ends of the cables 77 were connected to the corresponding four flanges 78 equipped with an N-type connector, which were attached to the wall surface of a discharge chamber (not shown). In the discharge chamber, a total of four coaxial cables 79 for vacuum use were connected the corresponding four power supply points 13 (13-1 to 13-4) of the ladder electrode 11. Each of the coaxial cables 79 had a length of 90 cm.

First, the lengths of the two coaxial cables 75 used in the two divided portions were set to 60 cm. The length extends along the coaxial cable 75 between a branch point within the N-type T adapter 74 and a branch point within the N-type T adapter 76. While matching was established by means of the matching unit 72, a VHF-band power of 100 MHz and 200 W was supplied. Deposition of film was performed at an SiH$_4$ flow rate of 200 sccm and a pressure of 80 mTorr. A uniform amorphous silicon film was deposited at a film deposition rate of 6.5 angstroms/s.

Next, the lengths of the two coaxial cables 75 used in the two divided portions were set to 50 cm. While matching was established, a VHF-band power of 100 MHz and 200 W was supplied. Deposition of film was performed at an SiH$_4$ flow rate of 200 sccm and a pressure of 80 mTorr. A uniform amorphous silicon film was deposited at a film deposition rate of 10.2 angstroms/s.

Through use of the coaxial cables 75, each having a length of 50 cm, film deposition rate was improved, for the following reason. The coaxial cable 73 has a characteristic impedance of 50 Ω; the two coaxial cables 75, each having a characteristic impedance of 50 Ω, are arranged in parallel with each other, resulting in a total characteristic impedance of 25 Ω; and the four coaxial cables 77, each having a characteristic impedance of 50 Ω, are arranged in parallel with each other, resulting in a total characteristic impedance of 12.5 Ω.

When three distributed-constant lines A, B, and C are connected as shown in FIG. 20; the relationship among the respective characteristic impedances $R_A$, $R_B$, and $R_c$ is represented by the following equation (1); and the length of central line B is ¼ RF wavelength λ, reflected waves from a position ① located between A and B and reflected waves from a position ② located between B and C cancel each other. As a result, reflections from the positions ① and ② become apparently zero.

$$R_B = \sqrt{R_A R_C} \qquad (1)$$

This principle is called "λ/4 transformer" and is described in, for example, a fourth prior-art document (Yoshihiro KONISHI, "Introduction to Radio Communication Circuits," Sogo Denshi Shuppan Sha, p.178).

In the present embodiment, the coaxial cable 73 may be considered as A; the two coaxial cables 75 may be considered as B; and the four coaxial cables 77 may be considered as C. Then, the following equation (2) holds.

$$R_A=50,\ R_B=25,\ R_C=12.5\ \ 25=\sqrt{50\cdot 12.5} \qquad (2)$$

Accordingly, when each of the two coaxial cables 75 corresponding to B has a length equal to ¼ wavelength, reflected waves at opposite ends of the cables 75 cancel each other, thereby becoming apparently zero.

As a result of reflected waves becoming zero, there is eliminated a portion of standing waves generated in the power transmission line extending between the matching unit 72 and the ladder electrode 11 which derives from branch points of the coaxial cable. When standing waves are present, large current portions and high voltage portions are produced, resulting in an increase in current loss and dielectric loss. However, since reflected waves became zero as mentioned above, these losses were considerably lessened. Conceivably, a portion of power which was lost in the course of transmission through the transmission line decreased, thereby increasing a portion of power to be used to generate plasma. Thus, film deposition rate as observed when the length of the coaxial cable 75 was 50 cm was higher than that as observed when the length was 60 cm.

The present embodiment uses the coaxial cable having a characteristic impedance of 50 Ω. However, even when a distributed-constant line having any characteristic impedance R is used, the following equation (3) holds. Thus, similar effects can be expected when two intermediate distributed-constant lines each have a length equal to λ/4.

$$R_{A=R,\ RB}=R/2,\ R_C=R/4 R_B=\sqrt{R_A\cdot R_C} \qquad (3)$$

Even when, after division into 4 portions, further division into 4 portions is to be performed for division into 16 portions, the above-mentioned method may be utilized accordingly.

As described above, according to the present invention, an amorphous thin film and a microcrystalline thin film can be formed while assuming a uniform thickness. Also, a thin film can be formed over a large area at sufficient uniformity (within ±10%). Thus, the invention is favorably applicable to the technology of forming Si-based thin films (for example, manufacture of solar cells and TFT).

Obviously, numerous modifications and variations of the present invention are possible in light of the above teachings. It is therefore to be understood that within the scope of the appended claims, the present invention may be practiced otherwise than as specifically described herein.

What is claimed is:

1. A discharge electrode of an RF plasma generation apparatus to which power is supplied from an RF power source through a matching unit, wherein the discharge electrode is of a ladder type or grid type having a power supply portion with at least two RF power supply points of substantially equal voltage.

2. A discharge electrode according to claim 1, wherein two groups of electrode bars, each group comprising a plurality of parallel electrode bars, are arranged perpendicular to each other; and the RF power supply points are arranged axisymmetrically with respect to a bisector which bisects sides of the RF discharge electrode.

3. An RF plasma generation apparatus in which a discharge electrode and substrate support means are disposed in parallel with each other within a reaction chamber, and RF power is supplied to the discharge electrode from an RF power source through a matching unit, wherein a discharge electrode according to claim 1 is used for the discharge electrode.

4. An RF plasma generation apparatus according to claim 3, wherein the power supply portion is located in a peripheral portion of the discharge electrode which does not face a substrate.

5. An RF plasma generation apparatus according to claim 3, wherein power transmission lines extending from the matching unit to the corresponding power supply points are of the same length.

6. An RF plasma generation apparatus according to claim 3, wherein a transmission line is connected to the power supply portion of the discharge electrode such that an uninsulated bare metallic connector for connecting the power supply point and a power line of the transmission line has a diameter at least equal to that of the electrode bar as measured in the vicinity of the power supply portion.

7. An RF plasma generation apparatus according to claim 3, wherein the distance between the power supply point and a metallic terminal member of a grounding line of a transmission line is at least 1 cm.

8. An RF plasma generation apparatus according to claim 3, wherein a transmission line is attached to the discharge electrode from opposite the substrate support means at an angle of at least 45° with respect to the discharge electrode.

9. An RF plasma generation apparatus according to claim 3, wherein the shortest distance between a metallic portion of a power line of a transmission line and a grounded member is at least 1 cm.

10. An RF plasma generation apparatus according to claim 3, wherein a metallic connector of the power supply portion of the discharge electrode is covered by an insulator having an outside diameter of 10 mm to 40 mm.

11. An RF plasma generation apparatus according to claim 10, wherein a gap between an outer circumferential surface of the metallic connector and an inner circumferential surface of the insulator is not greater than 3 mm.

12. An RF plasma generation apparatus according to claim 3, wherein a structure for power supply to the discharge electrode is an insulated structure such that a transmission line is connected to the discharge electrode by means of a connector and a receptacle in such a manner that a radial gap between an external shield and a core conductor within the interior of the connected connector and receptacle is not greater than 3 mm.

13. An RE plasma generation apparatus in which a discharge electrode and substrate support means are disposed in parallel with each other within a reaction chamber, and RF power is supplied to the discharge electrode from an RF power source through a matching unit, wherein the number and position of power supply points on the discharge electrode are determined such that the shortest distance as measured along the discharge electrode between at least one of the power supply points and any point located within a portion of a surface of the discharge electrode which faces a substrate is not greater than one-fourth of the in-vacuum wavelength of the RF power.

14. An RF plasma generation apparatus in which a discharge electrode and substrate support means are disposed in parallel with each other within a reaction chamber, and RF power is supplied to the discharge electrode from an RF power source through a matching unit, wherein in order to supply RF power to a plurality of points, the RF plasma generation apparatus comprises, as a power transmission line, a first coaxial cable for receiving an output from the RF power source and having an end divided to form two ends;

two second coaxial cables connected to the divided ends of the first coaxial cable, each of the second coaxial cables having a length equal to one-fourth of an in-cable wavelength of the RF power and a characteristic impedance equal to that of the first coaxial cable, and having an end divided to form two ends; and four third coaxial cables, each connected to a divided end of the second coaxial cables and having a characteristic impedance equal to that of the first coaxial cable.

15. An RF plasma generation apparatus according to claim 14, wherein the coaxial cable serves as a distributed constant line.

16. A power supply method for an RF plasma generation apparatus in which a ladder-type or grid-type discharge electrode and substrate support means are disposed in parallel with each other within a reaction chamber and in which RF power is supplied to the discharge electrode from an RF power source through a matching unit, wherein two or more power supply points of substantially equal voltage are employed for supply of power.

17. A power supply method according to claim 16, wherein the number and position of the power supply points are determined such that the shortest distance as measured along an electrode between at least one of the power supply points and any point located within a portion of a surface of the discharge electrode which faces a substrate is not greater than one-fourth of the in-vacuum wavelength of the RF power.

18. A power supply method according to claim 16, wherein in order to supply RF power to a plurality of points on the discharge electrode, a first coaxial cable having an end divided to form two ends is provided as a power transmission line in order to receive an output from the RF power source; two second coaxial cables, each having an end divided to form two ends, are connected to the divided ends of the first coaxial cable, each of the second coaxial cables having a length equal to one-fourth of an in-cable wavelength of the RF power and a characteristic impedance equal to that of the first coaxial cable; and four third coaxial cables, each having a characteristic impedance equal to that of the first coaxial cable, are connected to the divided ends of the second coaxial cables.

* * * * *